(12) United States Patent
Fong

(10) Patent No.: US 11,248,769 B2
(45) Date of Patent: Feb. 15, 2022

(54) OPTIC FOR TOUCH-SENSITIVE LIGHT EMITTING DIODE SWITCH

(71) Applicant: Peter Sui Lun Fong, Monterey Park, CA (US)

(72) Inventor: Peter Sui Lun Fong, Monterey Park, CA (US)

(*) Notice: Subject to any disclaimer, the term of this patent is extended or adjusted under 35 U.S.C. 154(b) by 13 days.

(21) Appl. No.: 16/380,721

(22) Filed: Apr. 10, 2019

(65) Prior Publication Data

US 2020/0326051 A1    Oct. 15, 2020

(51) Int. Cl.
| | |
|---|---|
| *F21V 5/00* | (2018.01) |
| *F21V 5/04* | (2006.01) |
| *F21V 7/28* | (2018.01) |
| *G06F 3/041* | (2006.01) |
| *G06F 3/044* | (2006.01) |
| *F21W 111/00* | (2006.01) |
| *F21Y 115/10* | (2016.01) |

(52) U.S. Cl.
CPC ............... *F21V 5/008* (2013.01); *F21V 5/04* (2013.01); *F21V 7/28* (2018.02); *G06F 3/044* (2013.01); *G06F 3/0416* (2013.01); *F21W 2111/00* (2013.01); *F21Y 2115/10* (2016.08)

(58) Field of Classification Search
None
See application file for complete search history.

(56) References Cited

U.S. PATENT DOCUMENTS

| | | | |
|---|---|---|---|
| 3,732,389 A | 5/1973 | Piatt et al. | |
| 4,054,814 A | 10/1977 | Fegley et al. | |
| 4,878,107 A | 10/1989 | Hopper | |
| 5,039,832 A | 8/1991 | Polacek et al. | |
| 5,343,064 A | 8/1994 | Spangler et al. | |
| 5,638,052 A | 6/1997 | Furuya et al. | |
| 5,708,297 A | 1/1998 | Clayton | |
| 6,087,842 A | 7/2000 | Parker et al. | |
| 6,335,548 B1 | 1/2002 | Roberts et al. | |
| 2002/0056806 A1 | 5/2002 | Bechtel et al. | |
| 2002/0171133 A1 | 11/2002 | Mok et al. | |
| 2002/0190326 A1 | 12/2002 | Nagao et al. | |
| 2003/0168670 A1 | 9/2003 | Roberts et al. | |

(Continued)

FOREIGN PATENT DOCUMENTS

| | | |
|---|---|---|
| CN | 201514944 U | 6/2010 |
| CN | 201608175 U | 10/2010 |

(Continued)

OTHER PUBLICATIONS

International Search Report and Written Opinion for PCT/US20/027627; dated Sep. 2, 2020.

(Continued)

*Primary Examiner* — Elmito Breval
(74) *Attorney, Agent, or Firm* — Stetina Burnda Garred & Brucker

(57) ABSTRACT

An optic assembly for a light emitting diode mounted to a printed circuit board has a primary lens defined by a primary lens anterior surface and an opposed primary lens rear taper with a tip facing the light emitting diode. A secondary lens with a secondary lens anterior surface and an opposed secondary lens posterior surface faces the printed circuit board. The secondary lens defines a central cavity with the primary lens being disposed therein.

20 Claims, 11 Drawing Sheets

(56) References Cited

U.S. PATENT DOCUMENTS

| | | |
|---|---|---|
| 2004/0067713 A1 | 4/2004 | Fong |
| 2004/0118669 A1 | 6/2004 | Mou |
| 2005/0103611 A1* | 5/2005 | Holscher .............. H01H 13/785 |
| | | 200/310 |
| 2005/0184374 A1 | 8/2005 | Ohe et al. |
| 2006/0022614 A1 | 2/2006 | Young |
| 2006/0050032 A1 | 3/2006 | Gunner et al. |
| 2006/0086689 A1 | 4/2006 | Raju |
| 2006/0086896 A1 | 4/2006 | Han |
| 2006/0262545 A1 | 11/2006 | Piepgras et al. |
| 2006/0267049 A1 | 11/2006 | Tang et al. |
| 2007/0090543 A1 | 4/2007 | Condie et al. |
| 2008/0137333 A1 | 6/2008 | Tamaoki et al. |
| 2008/0180390 A1 | 7/2008 | Yoshikawa |
| 2008/0230920 A1 | 9/2008 | Behrens |
| 2008/0238706 A1 | 10/2008 | Kenwright |
| 2008/0317293 A1 | 12/2008 | Sakurai et al. |
| 2009/0273570 A1 | 11/2009 | Degner et al. |
| 2010/0177058 A1 | 7/2010 | Lin |
| 2010/0193830 A1 | 8/2010 | Lin et al. |
| 2010/0321305 A1 | 12/2010 | Chang et al. |
| 2010/0328338 A1 | 12/2010 | Kim et al. |
| 2011/0140146 A1 | 6/2011 | Chen et al. |
| 2011/0297831 A1 | 12/2011 | Yao et al. |
| 2012/0094442 A1 | 4/2012 | Lin et al. |
| 2012/0140406 A1 | 6/2012 | Kliewer et al. |
| 2012/0140486 A1 | 6/2012 | Ciiou |
| 2012/0188172 A1 | 7/2012 | Fong |
| 2012/0195037 A1 | 8/2012 | Mazzochette |
| 2013/0223060 A1 | 8/2013 | Castillo |
| 2013/0341656 A1 | 12/2013 | Chan et al. |
| 2014/0145066 A1 | 5/2014 | Geaghan et al. |
| 2014/0168161 A1 | 6/2014 | Sugita et al. |
| 2014/0211503 A1* | 7/2014 | Tarsa .................. G02B 6/0036 |
| | | 362/608 |
| 2014/0255846 A1 | 9/2014 | Ikeda et al. |
| 2014/0353694 A1 | 12/2014 | Pang et al. |
| 2015/0030217 A1 | 1/2015 | Wickboldt et al. |
| 2015/0117011 A1 | 4/2015 | Wu et al. |
| 2016/0014308 A1 | 1/2016 | Yamazaki et al. |
| 2017/0024045 A1 | 1/2017 | Fong |
| 2018/0360243 A1 | 12/2018 | O'Neal |
| 2019/0235689 A1* | 8/2019 | Cheung ................ G06F 3/0488 |

FOREIGN PATENT DOCUMENTS

| | | |
|---|---|---|
| JP | 52132632 | 11/1977 |
| JP | 63501259 | 5/1988 |
| JP | 63501259 A | 5/1988 |
| JP | 04365382 A | 12/1992 |
| JP | 05251749 A | 9/1993 |

OTHER PUBLICATIONS

Elan Microelectronics Corp., eKT2101 Capacitive Touch Pad Controller., Apr. 2008. (50 pages).
Sensacell., Working with Sensacell., Dec. 2008. (5 pages).
Sensacell., Sensacell Module-Model HS164-36-RGB., Jun. 2009 (5 pages).
Japanese Office Action for JP 2017-068264; dated May 30, 2018.
International Search Report and Written Opinion for PCT/2012/020222, dated Apr. 25, 2012. (6 pages).
Chinese Office Action for Chinese Patent Application Serial No. 2012800144577, dated Jun. 24, 2015. 13 pages.
Supplemental European Search Report for EP 12 73 6497 dated Oct. 4, 2016.
English Translation of Tainwanese Office Action for 105144129; dated Aug. 14, 2017.
Canadian Office Action for CA 2,825,132; dated Apr. 18, 2019.
European Office Action for EP 12 736 497.4; dated Apr. 1, 2019.

* cited by examiner

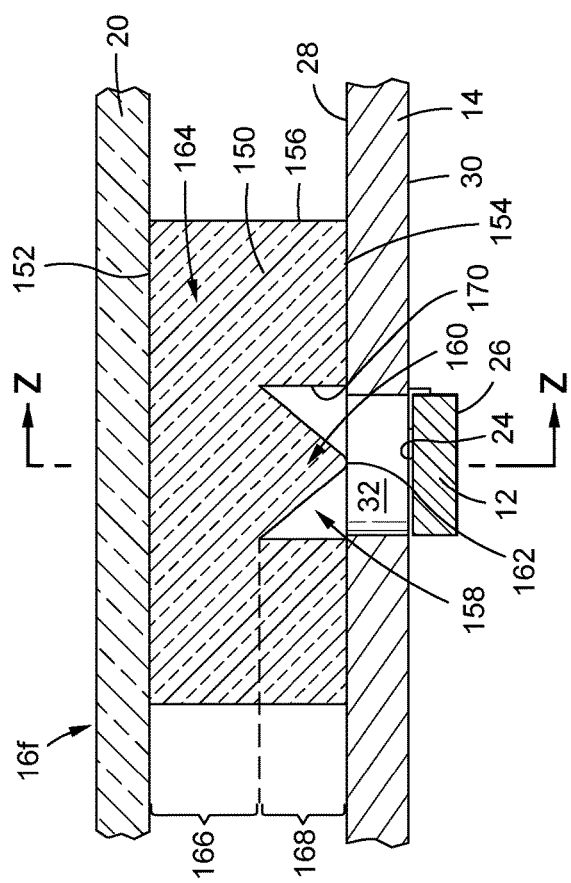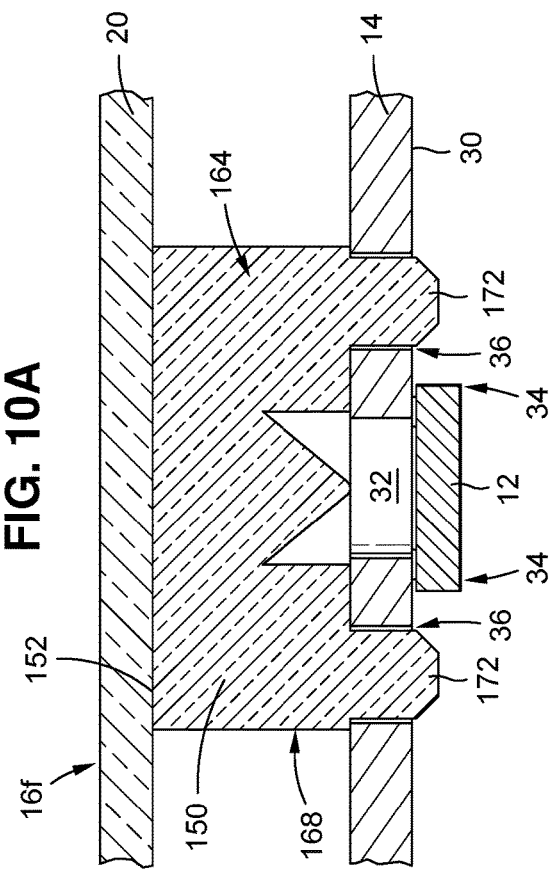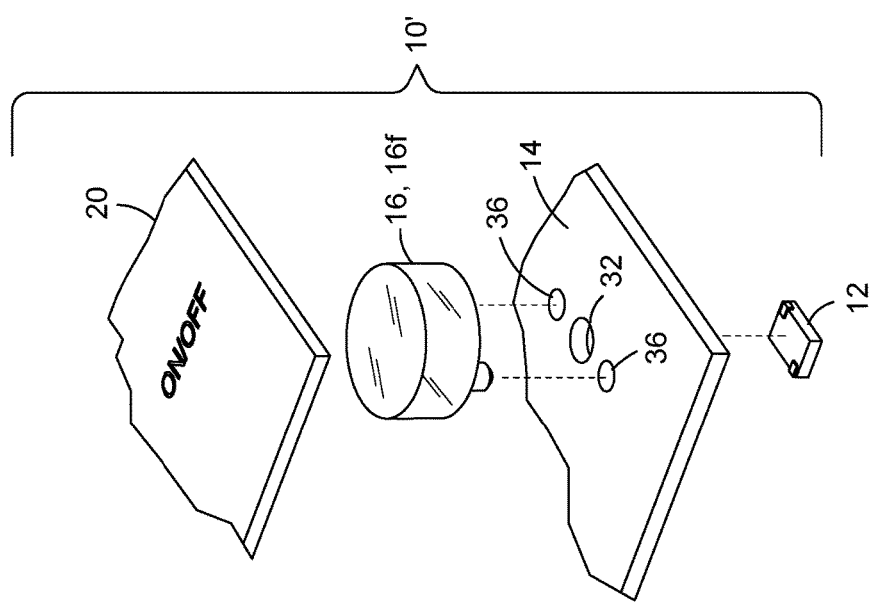

OPTIC FOR TOUCH-SENSITIVE LIGHT EMITTING DIODE SWITCH

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Technical Field

The present disclosure relates generally to optics and light emitting diodes (LEDs), and more particularly, to optics for touch-sensitive LED switch devices.

2. Related Art

LEDs are ubiquitous output devices that find many applications across a variety of fields for their high efficiency, fast switching, and extended longevity, among other advantages. One of the most common utility is as indicators for electronic devices, and so LEDs are available in packages of different shapes and sizes to suit the particular application. Additionally, different illumination colors or radiation wavelengths across the visible spectrum are available, from the low wavelength red to the high wavelength violet. Beyond the visible spectrum, however, there are LEDs capable of emitting infrared waves, which are typically utilized for inter-device communications. At the opposing end of the spectrum, ultraviolet waves may be utilized for sterilizing, sanitizing and disinfecting purposes. However, ultraviolet waves can also be used to cause ultraviolet-sensitive inks, dyes, paints, and various materials that are coated, painted, or pigmented with such inks, dyes, and paints to fluoresce or change color when illuminated to different visual effects. Although a typical miniature LED indicator light has an operating current of around 20 mA with less than 1 lumen of output, some recent high power LEDs are capable of operating currents of hundreds of mA and over a thousand lumens of output, which can serve as substitutes for incandescent bulbs in lighting applications.

The operational principles of LED devices are well known, with a central part being a semiconductor material that is doped to create a P-N junction. The anode, or the P-side of the junction is connected to a positive terminal of a power supply, while the cathode, or the N-side of the junction, is connected to a negative or common terminal of the power supply. As electricity flows between the P-N junction, energy in the form of a light photon is released. Whether utilized as a miniature low power indicator or as a high-intensity illuminator, LEDs operate in this manner.

In some applications, an LED can be utilized as a photodetector, where photons of light falling on the P-N junction are converted to an electrical signal. Instead of being connected to a power supply, the LED may be connected to a detection circuit to produce a response upon receiving a signal therefrom. Alternatively, the LED may incorporate contacts within the body that are connectible to a touch sensor integrated circuit. The contacts may be utilized as capacitive touch sensors to trigger an output upon a finger or other capacitive element interacting with the contacts. U.S. Pat. Nos. 8,866,708, 9,471,181, and 9,851,826 all to Fong, which is incorporated by reference herein in its entirety, discloses such a light emitting diode switch device. Thus, a single LED may be utilized for both output and input functions.

A variety of different LED packages are known in the art, though one of the most common the through-hole type comprised of a body with connecting wires extending therefrom. The body may be cylindrical with a partially spherical or dome top, though rectangular or square bodies with flat tops, or other geometric shapes exist. Generally, the body is constructed of a translucent plastic that has the same tint color as that of the emitted light, and the cathode, anode, and the electroluminescent semiconductor element, e.g., the diode, are encapsulated therein. In the aforementioned touch-sensitive LED switches, the touch sensor contacts are also understood to be encapsulated within the body. Beyond different types of through-hole packages, surface mount technology without wires extending therefrom are also utilized to package LEDs.

As mentioned above, LEDs are oftentimes used for indicating an operational state of an electronic device. Earlier electronic devices simply mounted the LED such that the light-emitting portion was exposed to the exterior of the device housing. The operational state(s)/output(s) indicated by the LED may simply have been described in separate documentation with no further descriptor on the device, or a descriptive label may have been affixed or printed adjacent to the LED. However, an improved device aesthetic and user interface experience may be achieved by selectively illuminating the descriptive label itself. For example, in a device power indicator, an "ON" descriptor may be directly illuminated when the device is powered on, and not illuminated when the device is powered off. A variety of configurations for such indicator functionality are known in the art, including forming a matrix of individual LEDs as point or segments of letters or other symbols, as well as cutting openings or partial etchings on the indicator surface corresponding to the letters or symbols, placing partially translucent diffusion filter covers thereon, and illuminating the cover from underneath the surface with an LED.

A typical LED, however, emits a relatively narrow light beam in comparison to more diffuse light sources such as incandescent bulbs, fluorescent tubes, and neon. Although uniform illumination of the entire diffusion filter cover is preferable, due to the lower beam width outputs of LEDs, there may be bright spots, dark spots, and other irregularities over its illumination area. When an irregular illumination effect is particularly pronounced, the indicator may not be readily discernible, or may appear deactivated when it is not. Accordingly, there is a need in the art for an improved optic for uniform illumination output from an LED over a wider area than conventional diffusers. There is also a need in the art for an optic for an indicator panels illuminated by LEDs, and retain the input functionality of capacitive touch sensor LED switch devices.

BRIEF SUMMARY

The present disclosure is directed to various embodiments of an optic assembly, an optic for an electroluminescent semiconductor device, and an illuminated indicator panel. In one embodiment the optic assembly is for a light emitting diode that may be mounted to a printed circuit board. The optic assembly may include a primary lens defined by a primary lens anterior surface and an opposed primary lens rear taper with a tip facing the light emitting diode. There may also be a secondary lens with a secondary lens anterior surface and an opposed secondary lens posterior surface facing the printed circuit board. The secondary lens may define a central cavity with the primary lens being disposed therein.

In another embodiment, the optic for an electroluminescent semiconductor device may include a lens having an annular notch formed therein. This notch may facilitate the formation of a tapered primary lens section with a tip facing the electroluminescent semiconductor device, as well as a secondary lens section encircling and interfacing with the primary lens section.

Yet another embodiment may be an illuminated indicator panel. This indicator panel may include a printed circuit board, as well as one or more electroluminescent semiconductor devices mounted to the printed circuit board. There may be one or more lenses each having an annular notch formed therein. This notch may facilitate the formation of a tapered primary lens section with a tip facing a respective one of the electroluminescent semiconductor devices. The notch may also facilitate the formation of a secondary lens section encircling and interfacing with the primary lens section. The lenses may be mounted to the printed circuit board. The illuminated indicator panel may include a panel cover with one or more indicia etched thereon overlapping each of the one or more lenses with the panel cover mounted thereto.

According to another embodiment of the present disclosure, there may be a combination illuminated indicator and input panel. It may include a printed circuit board defined by a top face and an opposed bottom face. Additionally, there may be one or more electroluminescent semiconductor devices mounted to the printed circuit board. The combination illuminated indicator and input panel may also include a first conductive layer on the top face of the printed circuit board that surrounds a region on which one of the one or more electroluminescent semiconductor devices is mounted. The first conductive layer may be connectible to an input of a touch sensor controller. There may also be a second conductive layer on the bottom face of the printed circuit board that surrounds the region on which the one of the one or more electroluminescent semiconductor devices is mounted. The first conductive layer and the second conductive layer may be in axial alignment. The combination illuminated indicator and input panel may also include a panel cover over the one or more electroluminescent semiconductor devices.

Another embodiment is an optic assembly for a light emitting diode mounted to a printed circuit board. There may be a primary lens defined by a primary lens anterior surface and an opposed primary lens posterior surface facing the light emitting diode. The optic assembly may also include a secondary lens with a secondary lens anterior surface and an opposed secondary lens posterior surface facing the printed circuit board. The secondary lens may define a central cavity with the primary lens being disposed therein.

The present disclosure will be best understood accompanying by reference to the following detailed description when read in conjunction with the drawings.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 9 is a perspective view of a sixth embodiment of the optic assembly;

FIG. 10A is a first cross-sectional view of the sixth embodiment of the optic assembly with an integral lens defined by a primary lens section with a conical taper and a secondary lens section;

FIG. 10B is a second cross-sectional view of the sixth embodiment of the optic assembly shown in FIG. 10A taken along axis Z-Z thereof with printed circuit board mounts being illustrated;

DETAILED DESCRIPTION

The detailed description set forth below in connection with the appended drawings is intended as a description of the several presently contemplated embodiments of an optic for both conventional light emitting diode (LED) devices and LED switch devices, and is not intended to represent the only form in which such embodiments may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
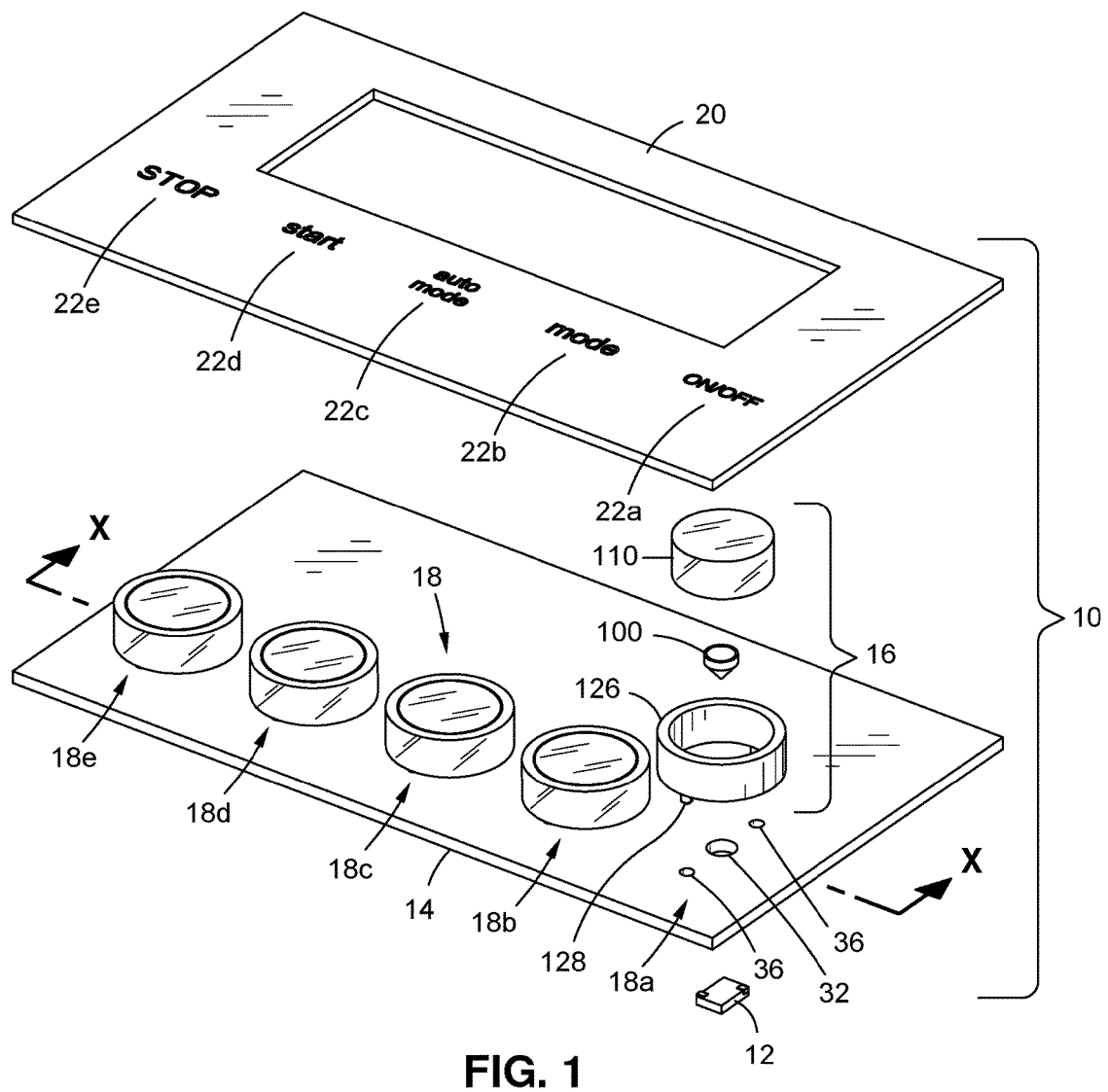
FIG. 1 is a perspective view of one embodiment of an illuminated indicator panel according to the present disclosure.

With reference to FIG. 1, various embodiments of the present disclosure contemplate an illuminated indicator panel 10 that may be utilized in an electronic device having various operational states indicated by outputs and controlled by inputs. The generating of such outputs and the reception of such inputs, which may be independent of each other, is understood to be implemented with a single touch-sensitive LED switch device 12.

As discussed earlier, the LED switch device 12 incorporates one or more capacitive touch sensors that are connectible to a touch sensor controller, as well as an electroluminescent semiconductor device that outputs light photons in response to an electrical stimulus that is generated by an LED driver circuit. More particularly, a finger or other capacitive element that is brought into proximity to a given one of the capacitive touch sensors is understood to trigger the detection of an input state by the touch sensor controller, while another component such as a microcontroller or general-purpose data processor generates commands to the LED driver circuit that causes the LED to illuminate. The LED switch device 12 is thus understood to serve simultaneously as an input device and an output device. While the disclosed embodiments utilize such a combined input/output LED switch device 12, it will be appreciated by those having ordinary skill in the art that a conventional output-only LED device may be substituted.

The LED switch device 12 is mounted to a printed circuit board 14 that interconnects the various input and output lines from the LED switch device 12 to the touch sensor controller, the LED driver circuit, and the microcontroller. According to various embodiments, interfaced with each of the LED switch devices 12 is an optic assembly 16, and the combination of the LED switch device 12 and the optic assembly may be referred to as lighted switch unit 18.

In the illustrated example, the illuminated indicator panel 10 may be configured for an electronic device that incorporates an input for starting a function, stopping a function, selecting an automatic operation mode, and selecting a mode. Additionally, the electronic device may be turned on and off via the illuminated indicator panel 10. In this regard, there is understood to be a first lighted switch unit 18a, a second lighted switch unit 18b, a third lighted switch unit 18c, a fourth lighted switch unit 18d, and a fifth lighted switch unit 18e corresponding to such input functions. These functions and inputs are presented by way of example only and not of limitation, as any other input function may be handled by the lighted switch units 18.

Mounted above the lighted switch units 18a-18d is a panel cover 20 with various indicia 22 that corresponds to the input functions of the respective one of the lighted switch units 18a-18e. As additionally shown in the cross-sectional view of FIG. 2, the panel cover 20 is understood to be mounted in alignment with the underlying printed circuit board 14, with the indicia being aligned and in an overlapping relationship with the lighted switch units 18. In the exemplary embodiment, the first lighted switch unit 18a may be for turning on and turning off the electronic device, and so it is aligned with the "ON/OFF" indicia 22a on the panel cover 20 when it is mounted to the printed circuit board 14. The second lighted switch unit 18b may be for mode selection input, and so it is aligned with the "mode" indicia 22b on the panel cover 20. The third lighted switch unit 18c may be for the auto mode selection input, and so it is aligned with the "auto mode" indicia 22c on the panel cover 20. The fourth lighted switch unit 18d may be for a start input, and so it is optically aligned with the "start" indicia 22d on the panel cover 20. Lastly, the fifth lighted switch unit 18e may be for a stop input, and thus it is aligned with the "STOP" indicia 22e on the panel cover 20.

The present disclosure contemplates an electroluminescent semiconductor element illuminating the indicia 22 from underneath the panel cover 20. More particularly, the electroluminescent semiconductor element that is integrated into the LED switch device 12 is driven on, and the light therefrom is evenly distributed across the entirety of the indicia 22 by the optic assembly 16, the structure and configuration of which will be described more fully below. Additionally, touch inputs upon the panel cover 20 in proximity to the respective indicia 22 are understood to be detectable via the touch sensors also within the lighted switch unit 18. That is, a touch input on or near the "ON/OFF" indicia 22a is understood to activate the functionality associated with the first lighted switch unit 18a, e.g., turning on or turning off the electronic device, a touch input on or near the "mode" indicia 22b is understood to activate the second lighted switch unit 18b, e.g., selecting an operating mode, and so forth.

The illumination of the indicia 22 is understood to be independent of the touch input. However, it is possible to change the output based on the touch input. As a general matter, the color/wavelength and the intensity of the light output from the electroluminescent semiconductor element of the LED switch device 12 may be varied. Further, it is possible for the LED driver circuit to pulse or otherwise time-sequence the output of the light. These visual effects may be combined and be output in response to a detection of the touch input. For example, the "ON/OFF" indicia 22a may be illuminated red while the electronic device is powered off, and a gradually approaching capacitive touch input may be responded to by flashing the LED switch device 12. Depending on the resolving capabilities of the touch sensor controller, the closer the finger is to the panel cover 20, the pulse can be output faster. Once the finger makes contact with the panel cover, the electronic device may be powered on, and the illumination color may be changed to green. This is but one exemplary input/output sequence, and other sequences/visual effects may be implemented.

The backlighting of the indicia 22 may be achieved in several different ways. In one embodiment, the panel cover 20 may be constructed of an opaque material, with the indicia 22 being cut through the entire thickness thereof. Optionally, a translucent or light-diffusing material may fill in the opening. In another embodiment, the indicia 22 may be etched partially into the panel cover 20 that is constructed of a partially opaque material, in which the reduced thickness of the etched portions being partially light-transmissive while the thicker, unetched portions being more opaque. In still another embodiment, the indicia 22 may be imprinted, silk-screen printed, or pad-printed with the indicia 22 in reverse white or light color while the rest of the surrounding background on the panel cover 20 may be printed or coated with a darker or denser-colored or opaque paint or material. Metal, glass, ceramic, glass ceramic, as well as plastic may be utilized for the panel cover 20, and those having ordinary skill in the art will recognize alternative ways and materials that may be substituted without departing from the scope of the present disclosure. In still another embodiment, there may be no indicia 22 on the panel cover 20, but may be included on the optic assembly 16. In such cases, the user-facing side of the optic assembly 16 may have an opaque coating applied thereto, and the indicia 22 may be laser etched in the coating. In another embodiment, the indicia 22 may likewise be omitted on a clear or translucent cover 20, but may be included on the optic assembly 16. With these embodiments, the user-facing side of the optic assembly 16 may have a light-colored, e.g., white translucent coating applied thereto, and a denser colored indicia 22 may be silk-screen printed, spray-painted, or pad-printed on top of the coating, or vice versa, e.g., reverse white indicia on a denser-colored background.

Figure 3A:
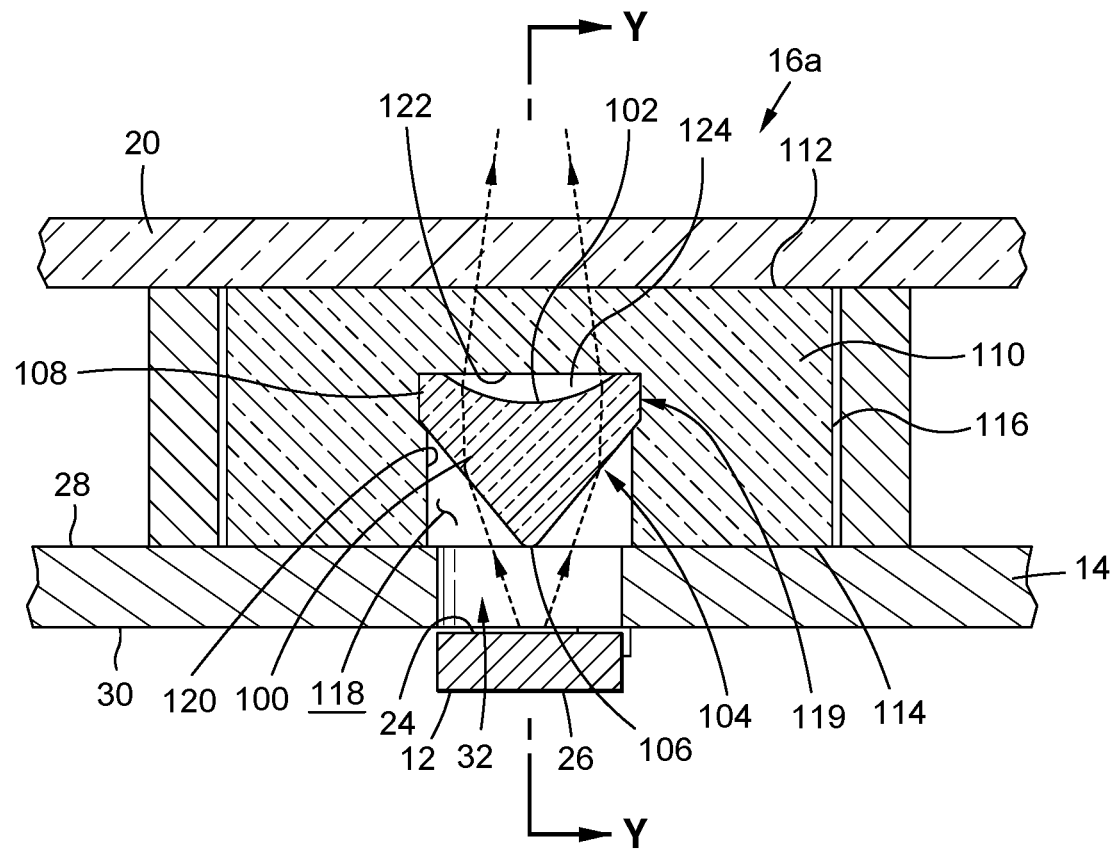
FIG. 3A is a first cross-sectional view of an optic assembly according to a first embodiment of the present disclosure including a primary lens and a secondary lens.
Figure 3B:
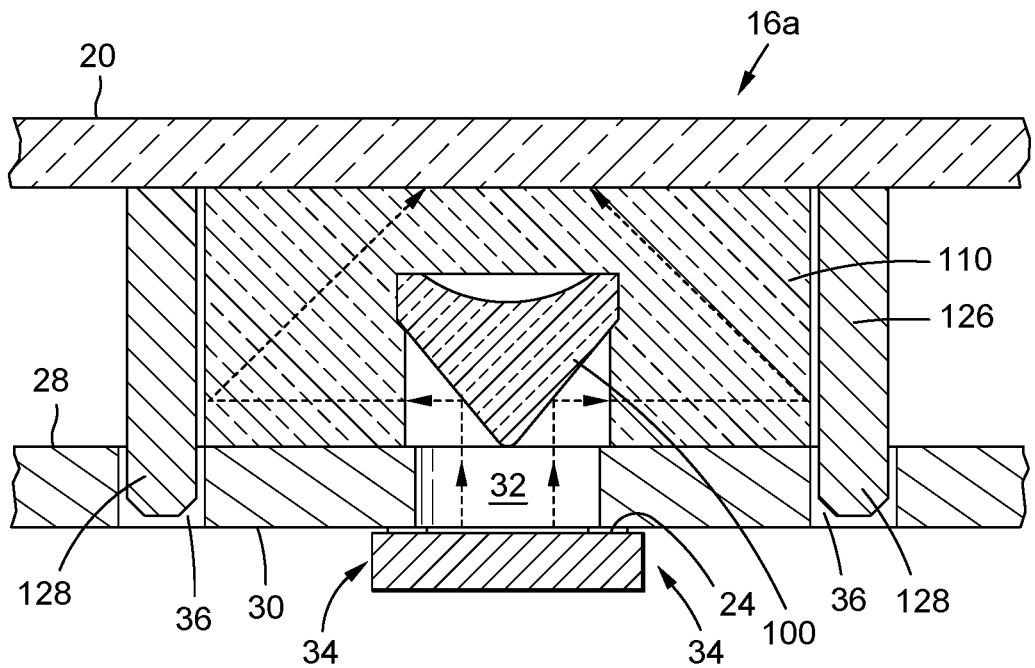
FIG. 3B is a second cross-sectional view of the optic assembly shown in FIG. 3A along a different axis Y-Y.

The illuminated indicator panel 10 utilizes a first embodiment of the optic assembly 16a, additional details of which are shown in FIGS. 3A and 3B. According to this embodiment, there is a primary lens 100 that is defined by a primary lens anterior surface 102 and an opposed primary lens rear taper 104 with a tip 106. In the illustrated embodiment, the primary lens 100 may also be defined by an outer cylindrical wall 108 between the primary lens anterior surface 102 and primary lens rear taper 104. Thus, the primary lens anterior surface 102 is circular, and in this first embodiment, the primary lens rear taper 104 has a conical shape. The tip 106 faces the LED switch device 12, which is defined by a light emitting side 24 and an opposed base side 26. The touch sensor contacts embedded within the package of the LED switch device 12 are understood to be disposed toward the light emitting side 24.

The illustrated optic assembly is presented by way of example only. The primary lens anterior surface 102 may be circular, oval, or any other desirable shape. Moreover, the primary lens rear taper 104 may be comprised of multiple flat facets angled relative to each other along a generally circular pattern and terminating at the tip 106, or spherical, pyramidal, ovoid, tetrahedral, or any other geometric shape that can be generally characterized as a taper and/or further aids in the even reflection of the light. Along these lines, the primary lens 100 may also be a sphere, an ovoid, or any round-shaped, ball-shaped, or other structure or profile. In such embodiments, when referring to the primary lens anterior surface 102, this may refer to a portion that comprises a half of the sphere or other ball-shaped structure. Furthermore, when referring to the primary lens rear taper 104, that portion may likewise be the other part or half of the sphere or other ball-shaped structure. Additional embodiments of the optic assembly 16 disclosed herein likewise include primary lenses defined by a primary lens anterior surface having specified geometric shapes, as well as primary lens rear tapers with specific geometric shapes. In the context of such additional embodiments, it is to be understood that the specific reference to the geometric shape of the primary lens anterior surface and/or the primary lens rear taper are exemplary only, and any other geometric shape including those mentioned above may be readily substituted in such alternative embodiments.

The illustrated embodiment utilizes the combined input/output LED switch device 12 that incorporates touch sensor contacts, but conventional output-only LEDs may be substituted while still retaining touch-input features. As will be described in further detail below, the printed circuit board 14 may include conductive traces underneath the optic assembly 16 that can substitute for, and/or supplement to touch sensor contacts in the LED switch device 12. In preferred, though optional embodiments, those configurations of the lighted switch unit 18 in which the LED switch device 12 is mounted to the bottom face 30 as shown in FIGS. 3A and 3B are those in which a substitution of a conventional LED for the LED switch device 12 would be most applicable.

The printed circuit board 14 is similarly defined by a top face 28 and an opposed bottom face 30. One embodiment of the illuminated indicator panel 10 contemplates the LED switch device 12 being mounted to the bottom face 30 of the printed circuit board 14, with the optic assembly 16 being mounted to its top face 28. Accordingly, the printed circuit board 14 further defines an aperture or opening 32, with the light emitting side 24 of the LED switch device 12 being axially aligned therewith. FIG. 3B best illustrates the mechanical attachment of the LED switch device 12 to the printed circuit board 14, with distal end portions 34 of the LED switch device 12 that extend beyond the opening 32 being fixed to the bottom face 30 of the printed circuit board 14.

The first embodiment of the optic assembly 16a further includes a secondary lens 110 that is generally defined by a secondary lens anterior surface 112 and an opposed secondary lens posterior surface 114. Generally, the secondary lens 110 has a cylindrical configuration with a vertical sidewall 116 defining its thickness between the secondary lens anterior surface 112 and the secondary lens posterior surface 114. Thus, the secondary lens anterior surface 112 has a circular profile. Likewise, the secondary lens posterior surface 114 has a circular outer profile. As mentioned above in relation to the primary lens 100, the specific reference to the geometric profile of the secondary lens 110 being cylindrical is likewise understood to be exemplary, and not limiting. Any other shape may be substituted without departing from the scope of the present disclosure. Furthermore, the additional embodiments of the optic assembly 16 disclosed further below also describe the secondary lens as having a cylindrical configuration, though these are understood to be by way of example only. In the context of such additional embodiments, alternative geometric shapes besides the noted cylindrical configuration may also be utilized, including oval, square, rectangular, rectangular with rounded corners, hexagonal, octagonal, and so on.

The secondary lens 110 further defines a central cavity 118, with its opening toward the secondary lens posterior surface 114. The central cavity 118 has a cylindrical configuration with a vertical sidewall 120, as well as a circular base cavity wall 122. With the central cavity 118 thus defined in the secondary lens 110, the secondary lens posterior surface 114 has a generally annular or ring-shaped profile. Fitted in the central cavity 118 is the primary lens 100. Again, although specific reference is made to a cylindrically configured central cavity 118, this is by way of example only and not of limitation. The central cavity 118 in this embodiment, as well as other central cavities in further embodiments disclosed below, may utilize an alternately shaped central cavity.

As illustrated, the diameter of the primary lens 100, and more particularly its outer cylindrical wall 108, is understood to be sized and configured for a frictional retention within the vertical sidewall 120 of the central cavity 118. That is, the circumference of the outer cylindrical wall 108 may be slightly larger than the circumference of the central cavity 118 of the secondary lens 110, with the vertical sidewall 120 of the central cavity 118 having an undercut ring section 119 to retain the primary lens 100 therein. Besides the foregoing frictional undercutting retention, other retention modalities such as glue or others may be substituted.

The primary lens anterior surface 102 also contacts or abuts against the circular base cavity wall 122. In the first embodiment of the optic assembly 16a, the primary lens anterior surface 102 has a concave configuration, so there may be a gap 124 between it and the circular base cavity wall 122. Fabrication of this embodiment of the optic assembly 16 may involve separately molding the primary lens 100 and the secondary lens 110, allowing for the concave primary lens anterior surface 102 to be formed, and then subsequently inserted into the central cavity 118.

The primary lens rear taper 104 and the vertical sidewall 120 of the secondary lens 110 is understood to define a reverse conical notch. The specific reference to the conical notch is understood to be by way of example only and not of limitation. Between potential variations in the central cavity 118 as well as the primary lens rear taper 104, there may be a variety of permutations of geometric shapes that this reverse conical notch may take. All such variations are deemed to be within the scope of the present disclosure, in both this embodiment of the optic assembly 16 as well as others disclosed hereinbelow.

The height of the primary lens 100, that is, the distance from the primary lens anterior surface 102 to the tip 106, is understood to substantially correspond to the depth of the central cavity 118. The secondary lens posterior surface 114 abuts against the top face 28 of the printed circuit board 14, while the primary lens 100 is positioned above the opening 32 of the printed circuit board 14. The principal axis of the primary lens 100 is in alignment with the center, light-emitting portion of the LED switch device 12. The output from the LED switch device 12 passes through the opening 32 of the printed circuit board 14, and diffused through the secondary lens 110, thereby evenly illuminating the indicia 22 on the panel cover 20 positioned on top of the secondary lens anterior surface 112. The surface area, circumference, or diameter of the primary lens 100 is understood to be equal to or greater than an emission window of the LED switch device 12, the central cavity 118, and/or the opening 32. This relationship between the size of the primary lens 100 and the other portions of the optic assembly 16 to which it interfaces is contemplated to reduce dark and hot spots when the secondary lens anterior surface 112 is illuminated.

Although the optic assembly 16 is contemplated to function based on the foregoing geometry, further improvements in diffusing the illumination output from the LED switch device 12 may be possible by coating the surfaces of the primary lens 100 and the secondary lens 110 with alternately light-reflective and light-absorptive/blocking coatings that are selectively applied to maximum effect. As a general matter, the primary lens 100 and the secondary lens 110 are transparent or translucent. In a preferred, though optional embodiment, the secondary lens 110 may be fabricated from silicone rubber, or polyvinyl chloride (PVC) plastic, etc. or any other suitable plastic materials, while the primary lens 100 may be fabricated also from silicone rubber, or another plastic material such as acrylonitrile butadiene styrene (ABS), PVC, or die-case metal alloy materials or any other suitable materials such as glass, ceramic, silicon, paper, and so forth. Silicone is understood to conduct the capacitive touch input to the LED switch device 12. Additionally, the silicone rubber may be fabricated to have a white tint that aids in the light diffusion.

In one embodiment, the outer surface of the vertical sidewall 116 may be coated with a light-absorptive material, e.g., black paint, to limit the amount of light leaking sideways where it is not visible to a viewer of the panel cover 20. Alternatively, the outer surface of the vertical sidewall 116 may be coated with a light-reflective material such as metallic silver paint, that reflects the light being transmitted outwardly toward the vertical sidewall 116, and back to the interior of the secondary lens 110. Along these lines, the contact area between the secondary lens posterior surface 114 and the printed circuit board 14 may be coated with a light-reflective material, e.g., silver or white paint. The outer surface of the primary lens rear taper 104 may be painted with a substantially light-transmissive coating such as white paint to allow the light from the LED switch device 12 to pass through to the primary lens 100 and diffused thereby, with the divergent light being transmitted to the entirety of the secondary lens 110, as shown in FIG. 3A. It is also possible to coat the outer surface of the primary lens rear taper 104 with a light-reflective material, e.g., metallic silver paint, to reflect the light from the LED switch device 12 and toward the cylindrical sidewall 120 defining the central cavity 118 of the secondary lens 110. In such embodiment, the secondary lens 110 is understood to diffuse the reflected light hitting the reflective surface of the primary lens rear taper 104, as depicted in FIG. 3B.

A secondary effect of the metallic silver paint is understood to be the increase in capacitive touch input sensitivity, as the additional metal layer serves as a capacitive touch contact even though it is not electrically connected to a touch sensor controller. Along these lines, additional metallic components may be added on top of or underneath the panel cover 20 without making electrical connections to other components of the lighted switch unit 18, including the optic assembly 16 or the LED switch device 12, and such metallic components are understood to enhance the capacitive touch input sensitivity. Thus, to the extent such metallic components are added on top of the panel cover 20, they may incorporate various ornamental features that enhance the aesthetic appeal of the overall device.

Figure 2:
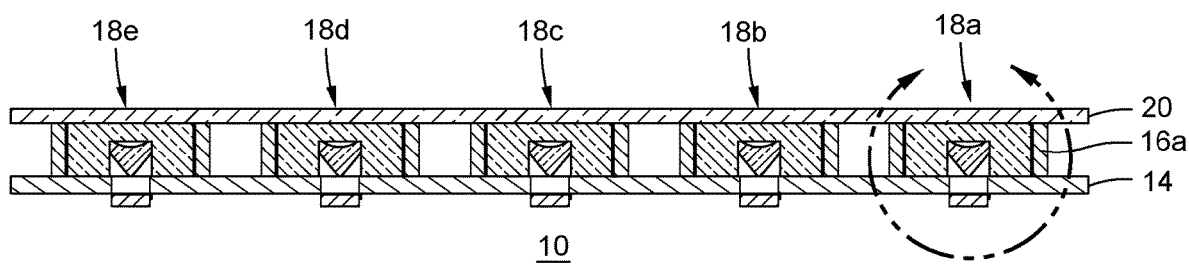
FIG. 2 is a cross-sectional view of the illuminated indicator panel shown in FIG. 1 taken along axis X-X.

With reference to FIG. 2 and FIG. 3B, various embodiments contemplate a lens holder 126 with an annular configuration that is sized and configured to retain the secondary lens 110 within. The lens holder 126 may include a pair of feet 128 that mate with a correspondingly positioned locator hole 36 defined by the printed circuit board 14. This engagement between the lens holder 126 and the printed circuit board 14 is understood to limit its axial rotation, and further, restrict the withdrawal of the secondary lens 110 along its central axis.

While various features of the optic assembly 16 have been described in the context of the first embodiment 16a, it will be understood that certain ones are not intended to be limited to such an embodiment. These features may be adapted to other embodiments described in more detail below, even if the description thereof does not make specific mention thereto. In this regard, unless otherwise indicated or described as mutually exclusive, or is contextually apparent from the descriptions that one feature in one embodiment is exclusive of another feature in a different embodiment, the features of the optic assembly are understood to be interchangeable.

Figure 4:
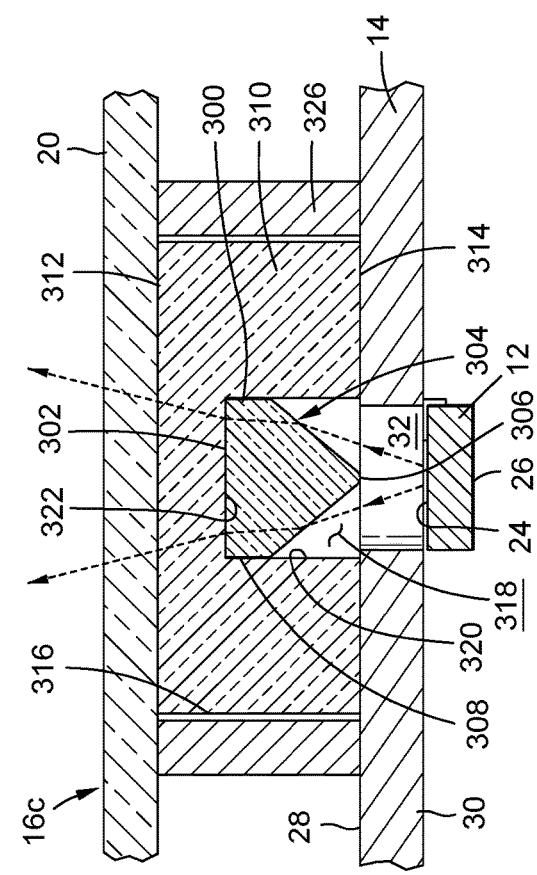
FIG. 4 is a cross-sectional view of a second embodiment of the optic assembly with an electroluminescent semiconductor element being mounted onto the same side of a printed circuit board as the primary and secondary lenses.

The cross-sectional view of FIG. 4 depicts a second embodiment of the optic assembly 16b, in which the LED switch device 12 and the optics are mounted to the same side of the printed circuit board 14. According to this embodiment, there is a primary lens 200 that is defined by a primary lens anterior surface 202 and an opposed primary lens rear taper 204 with a tip 206. The primary lens 200 may be defined by an outer cylindrical wall 208 between the primary lens anterior surface 202 and a primary lens rear taper 204. Thus, by way of example, the primary lens anterior surface 202 may be circular, and the primary lens rear taper 204 may have a conical shape. The tip 206 faces the LED switch device 12, which, again, is defined by the light emitting side 24 and the opposed base side 26.

As briefly mentioned above, the second embodiment of the optic assembly 16b contemplates the mounting of the LED switch device 12 on the top face 28 of the printed circuit board 14. A secondary lens 210 is also mounted to the top face 28 and is generally defined by a secondary lens anterior surface 212 and an opposed secondary lens posterior surface 214. The secondary lens 210 has a cylindrical configuration with a vertical sidewall 216 defining its thickness between the secondary lens anterior surface 212 and the secondary lens posterior surface 214. Like the first embodiment of the optic assembly 16b and its corresponding constituent parts, the secondary lens anterior surface 212 has a circular profile, and the secondary lens posterior surface 214 has a circular outer profile.

The secondary lens 210 further defines a central cavity 218, with its opening toward the secondary lens posterior surface 214. The central cavity 218 has a stepped cylindrical configuration with a first vertical sidewall 220 that is sized and configured to accept the LED switch device 12, and a second vertical sidewall 221 that is sized and configured to accept the primary lens 200. The central cavity 218 is further defined by a circular base cavity wall 222. The secondary lens posterior surface 214 thus has a generally annular profile. Fitted in the central cavity 218 is the primary lens 200 and the LED switch device 12, with the primary lens 200 being within the portion of the central cavity 218 corresponding to the second vertical sidewall 221 and the LED switch device 12 being within the portion of the central cavity 218 corresponding to the first vertical sidewall 220.

The diameter of the primary lens 200, and more particularly the circumference of its outer cylindrical wall 208, is understood to be sized and configured for a frictional retention within the second vertical sidewall 221 of the central cavity 218. Other retention modes may be substituted without departing from the scope of the present disclosure. The primary lens anterior surface 202 also abuts against a circular base cavity wall 222. In the second embodiment of the optic assembly 16b, the primary lens anterior surface 202 has a concave configuration, so there may be a gap 224 between it and the circular base cavity wall 222. Along these lines, the primary lens rear taper 204 and the second vertical sidewall 221 of the secondary lens 210 is understood to define a reverse conical notch.

The height of the primary lens 200 is understood to substantially correspond to the depth of the central cavity 218 spanning the second vertical sidewall 221, while height of the LED switch device 12 is understood to substantially correspond to the depth of the central cavity 218 spanning the first vertical sidewall 220. The secondary lens posterior surface 214 abuts against the top face 28 of the printed circuit board 14, and the first vertical sidewall 220 is oversized to accommodate the LED switch device 12. The primary lens 200 is positioned immediately above the LED switch device 12. The principal axis of the primary lens 200 is in alignment with the center, light-emitting portion of the LED switch device 12. The output from the LED switch device 12 is transmitted through the primary lens 200 and diffused through the secondary lens 210 to evenly illuminate the indicia 22 on the panel cover 20 positioned on top of the secondary lens anterior surface 212. A lens holder 226 with an annular configuration is sized and configured to retain the secondary lens 210 within.

Figure 5:
FIG. 5 is a cross-sectional view of a third embodiment of the optic assembly with an alternatively configured primary lens.

Referring now to the cross-sectional view of FIG. 5, a third embodiment of the optic assembly 16c utilizes an alternative primary lens configuration. Like the first embodiment 16a, the LED switch device 12 is mounted to the side of the printed circuit board opposite the side in which the optic assembly 16c is mounted. There is a primary lens 300 defined by a primary lens anterior surface 302 and an opposed primary lens rear taper 304 with a tip 306. The primary lens 300 may also be defined by an outer cylindrical wall 308 between the primary lens anterior surface 302 and primary lens rear taper 304. By way of example, the primary lens anterior surface 302 may be circular while a primary lens rear taper 304 may be conically shaped. The tip 306 faces the LED switch device 12, which is defined by a light emitting side 24 and an opposed base side 26.

Again, the printed circuit board 14 is defined by the top face 28 and an opposed bottom face 30. In this embodiment, the LED switch device 12 is mounted to the bottom face 30 of the printed circuit board 14, with the optic assembly 16c being mounted to its top face 28. The LED switch device 12 may be substituted with a conventional output-only LED while retaining touch input capabilities by virtue of a conductive trace being provided on the top face 28 and connected to a touch sensor controller, as will be described in further detail below. The printed circuit board 14 accordingly has the aperture or opening 32, with the light emitting side 24 of the LED switch device 12 being axially aligned therewith.

The third embodiment of the optic assembly 16c likewise includes a secondary lens 310 that is generally defined by a secondary lens anterior surface 312 and an opposed secondary lens posterior surface 314. The secondary lens 310 has a cylindrical configuration with a vertical sidewall 316 defining its thickness between the secondary lens anterior surface 312 and the secondary lens posterior surface 314. Thus, the secondary lens anterior surface 312 has a circular profile, and the secondary lens posterior surface 314 has a circular outer profile.

The secondary lens 310 further defines a central cavity 318, with its opening toward the secondary lens posterior surface 314. The central cavity 318 has a cylindrical configuration with a vertical sidewall 320, as well as a circular base cavity wall 322. With the central cavity 318 thus defined in the secondary lens 310, the secondary lens posterior surface 314 has a generally annular or ring-shaped profile. Fitted in the central cavity 318 is the primary lens 300.

The diameter of the primary lens 300, and more particularly its outer cylindrical wall 308, is sized and configured for a frictional retention within the vertical sidewall 320 of the central cavity 318. That is, the circumference of the central cavity 318 may be less than the circumference of the outer cylindrical wall 308 of the primary lens 300, with the central cavity 318 expanding to compressively retain the primary lens 300 therein. Alternatively, a double molding process in which the primary lens 300 is inserted and/or molded within and inside the central cavity 318 of the secondary lens 310 may be used. Other retention modalities are possible, as described more fully above.

The primary lens anterior surface 302 also contacts or abuts against the circular base cavity wall 322. In this illustrated embodiment, the primary lens anterior surface 302 is flat, so a substantial entirety thereof is understood to contact a substantial entirety of the circular base cavity wall 322. Like the other embodiments having the primary lens rear taper 304, the vertical sidewall 320 of the secondary lens 310 together with the primary lens rear taper 304 define a reverse conical notch. The specific reference to the conical notch is understood to be by way of example only and not of limitation. Between potential variations in the central cavity 318 as well as the primary lens rear taper 304, there may be a variety of permutations of geometric shapes that this reverse conical notch may take.

The height of the primary lens 300 may correspond to the depth of the central cavity 318. The secondary lens posterior surface 314 abuts against the top face 28 of the printed circuit board 14, while the primary lens 300 is positioned above the opening 32 of the printed circuit board 14. The optic assembly 16c includes a lens holder 326 having an annular configuration and is sized and configured to retain the secondary lens 310 within, and the lens holder 326 in turn is mounted to the printed circuit board 14. Optionally, the lens holder 326 may be integrated into the panel cover 20.

Figure 6:
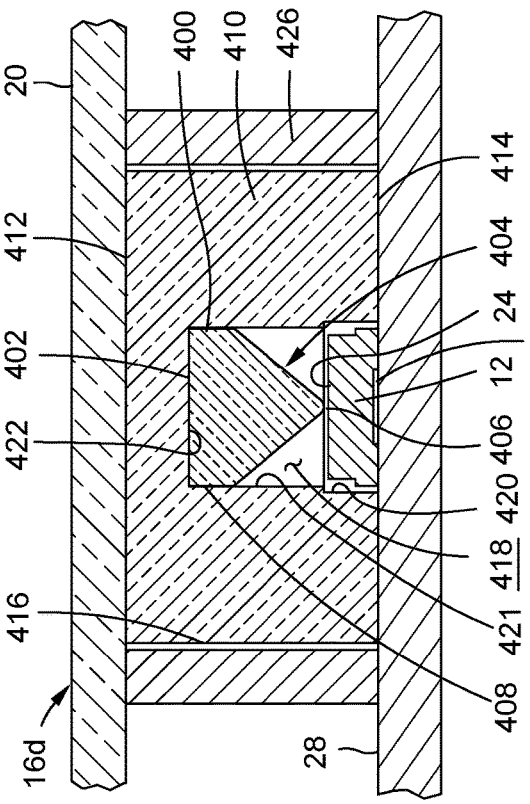
FIG. 6 is a cross-sectional view of a fourth embodiment of the optic assembly with the primary lens as shown in FIG. 5 and the electroluminescent semiconductor element mounted onto the same side of the printed circuit board as the primary and secondary lenses.

FIG. 6 depicts a fourth embodiment of the optic assembly 16d in which the LED switch device 12 and the optics are mounted to the same side of the printed circuit board 14 and utilizing the primary lens configuration of the third embodiment 16c. The primary lens 400 is defined by a primary lens anterior surface 402 and an opposed primary lens rear taper 404 with a tip 406. The primary lens 400 may be defined by an outer cylindrical wall 408 between the primary lens anterior surface 402 and a primary lens rear taper 404. By way of example, the primary lens anterior surface 402 may be circular, and the primary lens rear taper 404 may have a conical shape. The tip 406 faces the LED switch device 12, which, again, is defined by the light emitting side 24 and the opposed base side 26.

A secondary lens 410 is also mounted to the top face 28 and is generally defined by a secondary lens anterior surface 412 and an opposed secondary lens posterior surface 414. The secondary lens 410 has a cylindrical configuration with a vertical sidewall 416 defining its thickness between the secondary lens anterior surface 412 and the secondary lens posterior surface 414. The secondary lens anterior surface 412 has a circular profile, and the secondary lens posterior surface 414 has a circular outer profile.

The secondary lens 410 further defines a central cavity 418, with its opening toward the secondary lens posterior surface 414. The central cavity 418 has a stepped cylindrical configuration with a first vertical sidewall 420 that is sized and configured to accept the LED switch device 12, and a second vertical sidewall 421 that is sized and configured to accept the primary lens 400. The central cavity 418 is additionally defined by a circular base cavity wall 422. The secondary lens posterior surface 414 accordingly has a generally annular profile. Fitted in the central cavity 418 is the primary lens 400 and the LED switch device 12, with the primary lens 400 being within the portion of the central cavity 418 corresponding to the second vertical sidewall 421 and the LED switch device 12 being within the portion of the central cavity 418 corresponding to the first vertical sidewall 420.

The diameter of the primary lens 400/the circumference of its outer cylindrical wall 408 is understood to be sized and configured for a frictional retention of the primary lens 400 within the second vertical sidewall 421 of the central cavity 418. The primary lens anterior surface 402 also contacts or abuts against the circular base cavity wall 422. Like the third embodiment of the optic assembly 16c, the primary lens anterior surface 402 of the fourth embodiment of the optic assembly 16d is flat, so a substantial entirety thereof is understood to contact a substantial entirety of the circular base cavity wall 422. Like the other embodiments having the primary lens rear taper 404, the first vertical sidewall 420 of the secondary lens 410 together with the primary lens rear taper 404 define a reverse conical notch. The specific reference to the conical notch is understood to be by way of example only and not of limitation. Between potential variations in the central cavity 418 as well as the primary lens rear taper 404, there may be a variety of permutations of geometric shapes that this reverse conical notch may take.

The height of the primary lens 400 is understood to substantially correspond to the depth of the central cavity 418 spanning the second vertical sidewall 421, while height of the LED switch device 12 is understood to substantially correspond to the depth of the central cavity 418 spanning the first vertical sidewall 420. The secondary lens posterior surface 414 abuts against the top face 28 of the printed circuit board 14, and the first vertical sidewall 420 is oversized to accommodate the LED switch device 12. The primary lens 400 is positioned immediately above the LED switch device 12. The principal axis of the primary lens 400 is in alignment with the center, light-emitting portion of the LED switch device 12. The output from the LED switch device 12 is transmitted through the primary lens 400 and diffused through the secondary lens 410 to evenly illuminate the indicia 22 on the panel cover 20 positioned on top of the secondary lens anterior surface 412. A lens holder 426 having an annular configuration is sized and configured to retain the secondary lens 410 within, though it is also possible to incorporate the lens holder 426 into the panel cover 20.

Figure 7:
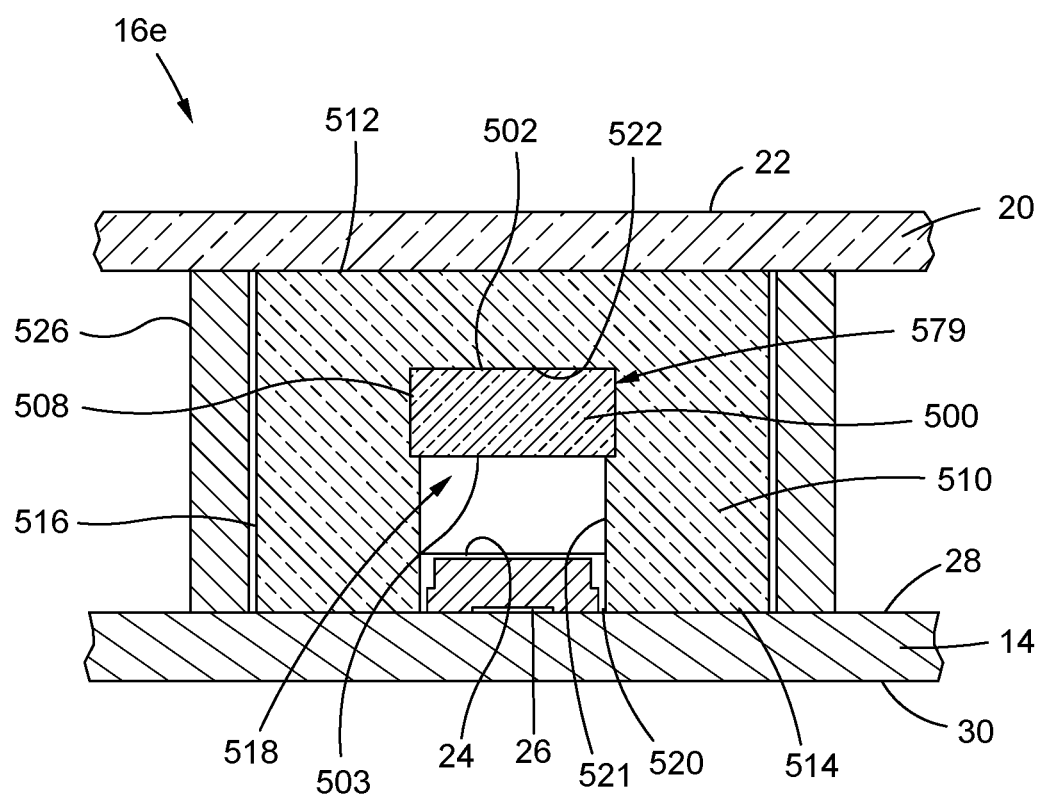
FIG. 7 is a cross-sectional view of a fifth embodiment of the optic assembly with a disk-shaped primary lens.

FIG. 7 depicts a fifth embodiment of the optic assembly 16e where the LED switch device 12 and the optics are likewise mounted to the same side of the printed circuit board 14, though with an alternatively configured primary lens 500 that is defined by a primary lens anterior surface 502 and an opposed primary lens posterior surface 503. The primary lens 500 is thus contemplated to be disk-shaped, that is, both the primary lens anterior surface 502 and the primary lens posterior surface 503 are circular or substantially circular with an outer cylindrical wall 508 between such surfaces that define a thickness of the primary lens 500. The primary lens posterior surface 503 faces the LED switch device 12, which, again, is defined by the light emitting side 24 and the opposed base side 26.

The optic assembly 16e also includes a secondary lens 510 that has a similar structure and configuration as other secondary lenses discussed above. More particularly, the secondary lens 510 is mounted to the top face 28 of the printed circuit board 14, and is defined by a secondary lens anterior surface 512 and an opposed secondary lens posterior surface 514. The secondary lens 510 has a cylindrical configuration with a vertical sidewall 516 defining its thickness between the secondary lens anterior surface 512 and the secondary lens posterior surface 514. The secondary lens anterior surface 512 has a circular profile, and the secondary lens posterior surface 514 has a circular outer profile.

The secondary lens 510 further defines a central cavity 518, with its opening toward the secondary lens posterior surface 514. The central cavity 518 has a stepped cylindrical configuration with a first vertical sidewall 520 that is sized and configured to accept the LED switch device 12, and a second vertical sidewall 521 that is sized and configured to accept the primary lens 500. The central cavity 518 is additionally defined by a circular base cavity wall 522. The secondary lens posterior surface 514 accordingly has a generally annular profile. Fitted in the central cavity 518 is the primary lens 500 and the LED switch device 12, with the primary lens 500 being within the portion of the central cavity 518 corresponding to the second vertical sidewall 521 and the LED switch device 12 being within the portion of the central cavity 518 corresponding to the first vertical sidewall 520.

The diameter of the primary lens 500, and more particularly its outer cylindrical wall 508, is understood to be sized and configured for a frictional retention within the vertical sidewall 521 of the central cavity 118. That is, the circumference of the outer cylindrical wall 508 may be slightly larger than the circumference of the central cavity 518 of the secondary lens 510, with the vertical wall 508 of the central cavity 518 having an undercut ring section 519 to retain the primary lens 500 therein. Other retention modalities such as glue or others may be substituted. The primary lens anterior surface 502 also contacts or abuts against the circular base cavity wall 522. In the illustrated embodiment, the primary lens anterior surface 502 is flat, so a substantial entirety thereof is understood to contact a substantial entirety of the circular base cavity wall 522. The thickness of the primary lens 500 may vary, and may be as thin as a single coating of material that is applied to the circular base cavity wall 522. It is possible to integrally form the primary lens 500 and the secondary lens 510 as a single lens structure, and those portions of such single lens structure may correspond to or otherwise relate to the separate primary lens 500 and secondary lens 510.

Figure 8A:
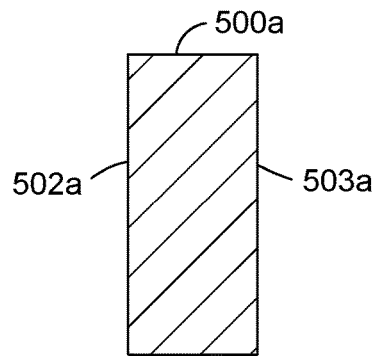
FIGS. 8A-8I illustrate various profiles of the primary lens utilized in the optic assembly shown in FIG. 7.
Figure 8B:
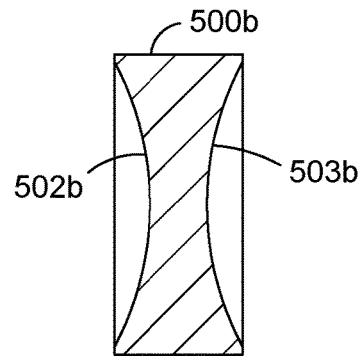
Figure 8C:
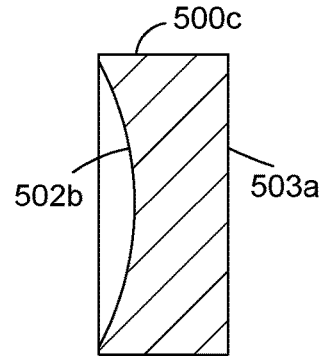
Figure 8D:
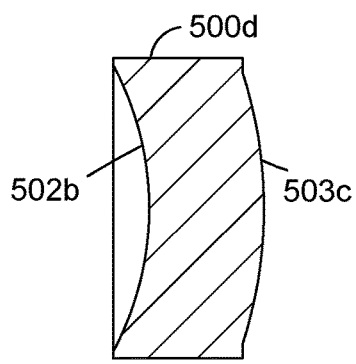
Figure 8E:
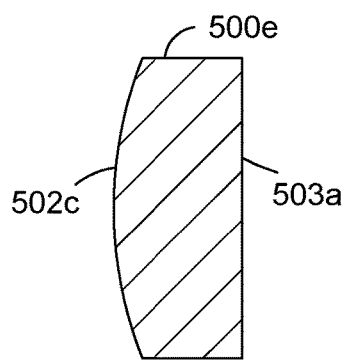
Figure 8F:
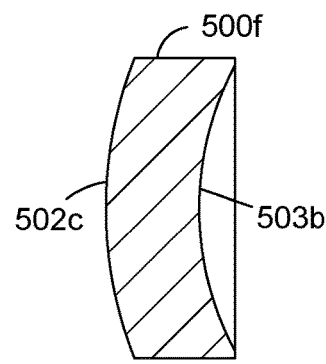
Figure 8G:
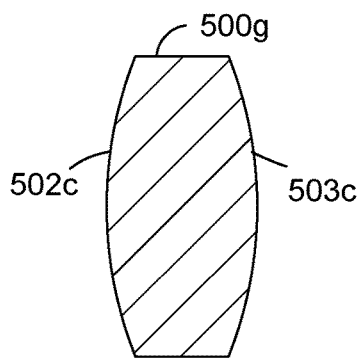
Figure 8H:
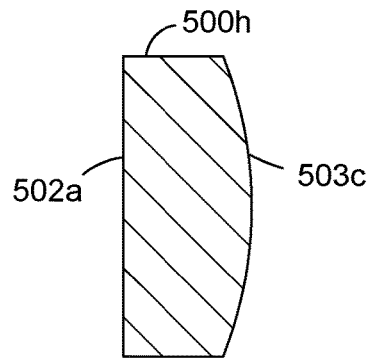
Figure 8I:
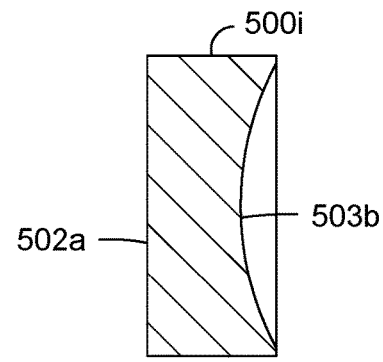

Unlike the previously described embodiments, the primary lens 500 does not define a rear taper and hence there is no tip. The entirety of the primary lens posterior surface 503 is thus understood to face the LED switch device 12. Like the other embodiments, however, the various surfaces or portions of the primary lens 500 may be painted with alternately reflective/white coatings or light-absorptive/black coatings to maximize light transmission and dispersion effects. Furthermore, the primary lens anterior surface 502 and the primary lens posterior surface 503 may have varying profiles that can be selected for desirable effects. FIG. 8A illustrates one such variation 500a of the primary lens. This variant is characterized by a flat anterior surface 502a and a flat posterior surface 503a. FIG. 8B depicts a second variation 500b of the primary lens with a concave anterior surface 502b and a concave anterior surface 503b. FIG. 8C shows a third variation 500c of the primary lens with the concave anterior surface 502b and the flat posterior surface 503a. FIG. 8D shows a fourth variation 500d with the concave anterior surface 502b and a convex posterior surface 503c. FIG. 8E shows a fifth variation 500e with a convex anterior surface 502c and the flat posterior surface 503a. FIG. 8F shows a sixth variation 500f with the convex anterior surface 502c and the concave posterior surface 503b. FIG. 8G shows a seventh variation 500g with the convex anterior surface 502c and the convex posterior surface 503c. FIG. 8H shows an eighth variation 500h with the flat anterior surface 502a and the convex posterior surface 503c. Lastly, FIG. 8I shows a ninth variation 500i with the flat anterior surface 502a and the concave posterior surface 503b. Each of these combinations of posterior/anterior surfaces are understood to exhibit different light transmission and diffusion effects when combined with the secondary lens 510, and those having ordinary skill in the art will be able to select the combination for a particular effect or extent of the effect.

The primary lens 500 is positioned immediately above the LED switch device 12. The principal axis of the primary lens 500 is in alignment with the center, light-emitting portion of the LED switch device 12. The output from the LED switch device 12 is transmitted through the primary lens 500 and diffused through the secondary lens 510 to evenly illuminate the indicia 22 on the panel cover 20 positioned on top of the secondary lens anterior surface 512. A lens holder 526 having an annular configuration is sized and configured to retain the secondary lens 510 within, though the lens holder 526 may be included as part of the panel cover 20.

Another embodiment of the illuminated indicator panel 10' contemplates the integration of the primary lens and the secondary lens as a single, unitary structure. Such an alternative configuration may also be characterized as a single lens with various sub-features that are part of the same structure, as illustrated in FIGS. 9, 10A, and 10B and described with reference thereto. A sixth embodiment of the optic assembly 16f has a lens 150 defined by an anterior surface 152 and an opposed posterior surface 154. The anterior surface 152 is understood to be flat and circular, as the lens 150 has a cylindrical shape with a vertical sidewall 156.

The lens 150 also includes an annular notch 158 formed therein as to facilitate the formation of a tapered primary lens section 160 with a tip 162 facing the electroluminescent semiconductor element of the LED switch device 12. The annular notch 158 also facilitates the formation of a secondary lens section 164 that encircles the tapered primary lens section 160 and interface with the same. More particularly, the vertical depth or extent of the annular notch 158 generally bisects the lens 150 into an upper portion 166 having a flat, disc-shaped configuration that at least partially interfaces with the tapered primary lens section 160, and a lower portion 168 having an annular or ring-shaped configuration that encircles the tapered primary lens section 160. In this regard, the interior of the annular notch 158 may also be defined by a vertical interior sidewall 170.

In the illustrated embodiment, the tapered primary lens section 160 has a conical shape, though this is by way of example only and not of limitation. Alternative configurations may include a tapered primary lens section comprised of multiple flat facets angled relative to each other along a generally circular pattern and terminating at the tip 162, spherical, pyramidal, tetrahedral, or any other geometric shape that can be generally characterized as a taper and/or further aids in the even reflection of the light. Additional embodiments of the optic assembly 16 disclosed herein likewise include specified geometric shapes of the tapered primary lens section 160. In the context of such additional embodiments, it is to be understood that the specific reference to the geometric shape are exemplary only, and any other geometric shape including those mentioned above may be readily substituted in such alternative embodiments.

The tip 162 faces the LED switch device 12, which is defined by a light emitting side 24 and an opposed base side 26. The touch sensor contacts embedded within the package of the LED switch device 12 are understood to be disposed towards the light emitting side 24.

The LED switch device 12 may be mounted to the bottom face 30 of the printed circuit board 14, with the sixth embodiment of the optic assembly 16*f* being mounted to its top face 28. The annular notch 158 of the lens 150 thus opens to the opening 32 of the printed circuit board 14, with the light emitting side 24 of the LED switch device 12 being axially aligned with the tapered primary lens section 160 and its tip 162 in particular. The tip 162 is co-extensive with the posterior surface 154 of the lens 150. FIG. 10B illustrates the mechanical attachment of the LED switch device 12 to the printed circuit board 14, with distal end portions 34 of the LED switch device 12 that extend beyond the opening 32 being fixed to the bottom face 30 of the printed circuit board 14.

This embodiment of the lens 150 is also understood to incorporate features of the lens holder that were otherwise separate components in different embodiments. In this regard, extending from the lower portion 168 of the secondary lens section 164 and beyond the posterior surface 154 are a pair of feet 172 that are insertable into the locator holes 36 defined in the printed circuit board 14. This engagement between the lens 150 and the printed circuit board 14 is understood to limit its axial rotation, and further, restrict the withdrawal of the lens 150 along its central axis away from the printed circuit board 14. The optic assembly 16*f* may also be retained by the compressive force imparted thereon by the panel cover 20, which is facing the anterior surface 152 of the lens 150.

The principal axis of the primary lens 160 is in alignment with the center, light-emitting portion of the LED switch device 12. The output from the LED switch device 12 passes through the opening 32 of the printed circuit board 14 and diffused through the secondary lens section 164, thereby evenly illuminating the indicia 22 on the panel cover 20 positioned on top of the secondary lens anterior surface 152. To the extent the indicia 22 is imprinted on the lens 150, it is to be understood that such indicia is similarly illuminated.

As with the embodiments of the optic assembly 16 discussed above, the sixth embodiment 16*f* further contemplates improvements in diffusing the illumination output from the LED switch device 12 by coating the surfaces of the tapered primary lens section 160 and the secondary lens section 164 with alternately light-reflective and light-absorptive/blocking coatings that are selectively applied to maximum effect. Generally, the lens 150 is understood to be transparent or translucent. In a preferred, though optional embodiment, the lens 150 may be fabricated from silicone rubber, or another plastic material such as ABS, PVC, and so forth. The silicone rubber may be fabricated to have a white tint that aids in the light diffusion.

In one embodiment, the outer surface of the vertical sidewall 156 may be coated with a light-absorptive material, e.g., black paint, to limit the amount of light leaking sideways where it is not visible to a viewer of the panel cover 20. Alternatively, the outer surface of the vertical sidewall 156 may be coated with a light-reflective material such as metallic silver paint, that reflects the light being transmitted outwardly toward the vertical sidewall 156, and back to the interior of the lens 150. The outer surface of the tapered primary lens section 160, as well as the printed circuit board 14 in those areas contacting the posterior surface 154 of the lens 150 may be coated with a light-reflective material, e.g., solid white paint or metallic silver paint, and so on, to better reflect and disperse the light from the LED switch device 12.

The outer surface of the primary lens section 160 may be painted with a substantially light-transmissive coating such as white paint to allow the light from the LED switch device 12 to pass through to the primary lens section 160 and diffused thereby, with the divergent light being transmitted to the entirety of the secondary lens section 164. It is also possible to coat the outer surface of the primary lens section 160 with a light-reflective material to reflect the light from the LED switch device 12 and toward the vertical interior sidewall 170. In such embodiment, the secondary lens section 164 is understood to diffuse the reflected light hitting the reflective surface of the primary lens section 160. A secondary effect of the metallic silver paint is understood to be the increase in capacitive touch input sensitivity, as the additional metal layer serves as a capacitive touch contact even though it is not electrically connected to a touch sensor controller.

Figure 11:
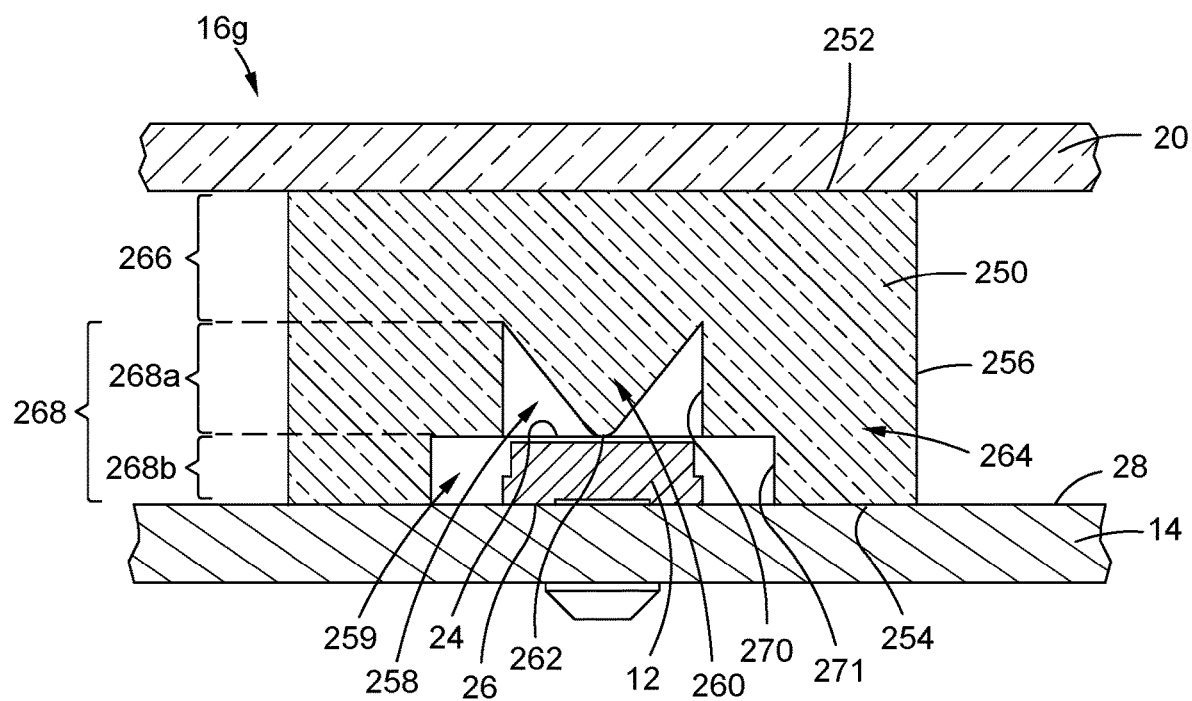
FIG. 11 is a cross-sectional view of a seventh embodiment of the optic assembly with the electroluminescent semiconductor element being mounted on the same side of the printed circuit board as the integral lens.

The cross-sectional view of FIG. 11 is of a seventh embodiment of the optic assembly 16*g*, in which the LED switch device 12 and the optics are mounted to the same side of the printed circuit board 14. According to this embodiment, there is a lens 250 defined by an anterior surface 252 and an opposed posterior surface 254. The anterior surface 252 is understood to be flat and circular, as the lens 250 has a cylindrical shape with a vertical sidewall 256.

The lens 250 also includes an annular notch 258 formed therein as to facilitate the formation of a tapered primary lens section 260 with a tip 262 facing the electroluminescent semiconductor element of the LED switch device 12. In this regard, the light-emitting side 24 thereof is understood to face upwardly toward the tip 262, while the base side 26 is attached to the printed circuit board 14. The annular notch 258 includes a counterbore 259 that enlarges the diameter thereof and provide additional clearance for the LED switch device 12 as it is mounted on the same side of the printed circuit board 14. The annular notch 258 facilitates the formation of a secondary lens section 264 that encircles the tapered primary lens section 260 and interface with the same. The vertical depth or extent of the annular notch 258 generally bisects the lens 250 into an upper portion 266 having a flat, disc-shaped configuration that at least partially interfaces with the tapered primary lens section 260, and a lower portion 268 having an annular or ring-shaped configuration, at least a part of which encircles the tapered primary lens section 260.

In further detail, the lower portion 268 may be segregated into a first half 268*a* that encircles the tapered primary lens section 260, and a lower half 268*b* that defines the aforementioned counterbore 259. The interior of the annular notch 258 may be defined by a first vertical interior sidewall 270, along with a second vertical interior sidewall 271 corresponding to that of the counterbore 259. The height of the second vertical interior sidewall 271 is understood to be substantially equivalent to that of the LED switch device 12, while the height of the first vertical interior sidewall 270 is understood to be substantially equivalent to that of the tapered primary lens section 260.

Figure 12:
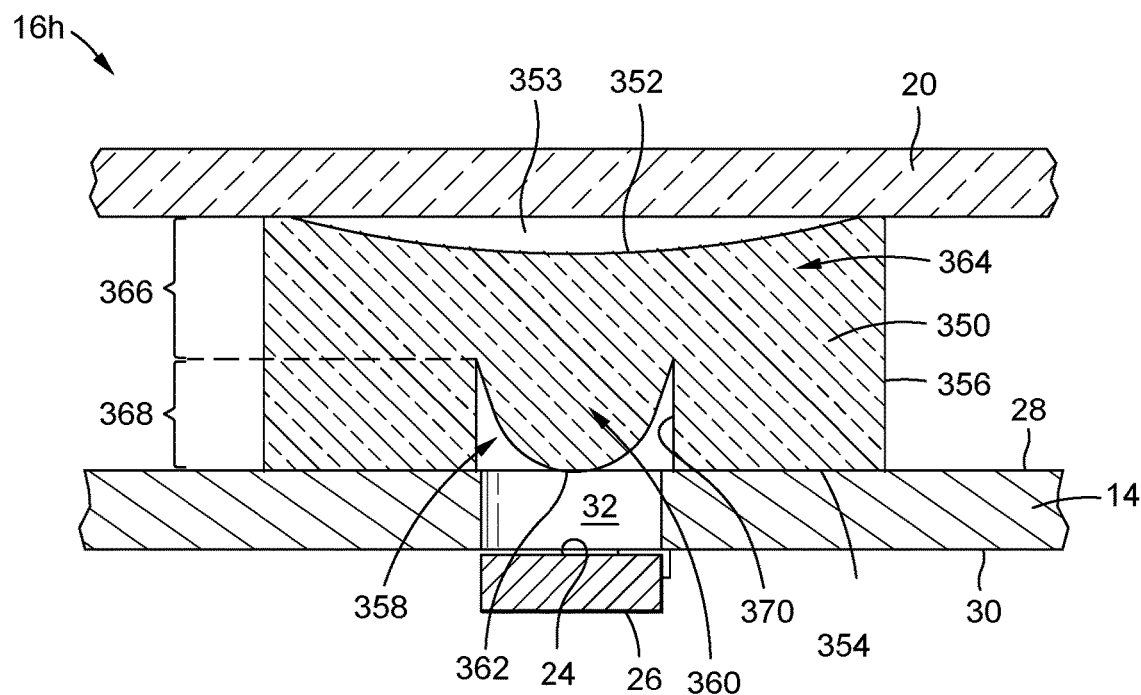
FIG. 12 cross-sectional view of an eighth embodiment of the optic assembly with an alternately configured primary lens section with a spherical taper.

An eighth embodiment of the optic assembly 16*h* as shown in FIG. 12 has a lens 350 defined by an anterior surface 352 and an opposed posterior surface 354. Unlike the other single-lens configurations discussed above, in this embodiment the anterior surface 352 is concave, with a gap 353 being defined between the lens 350 and the panel cover 20. Similar to those embodiments, however, the lens 350 has a cylindrical shape and thus the anterior surface 352 is circular. The lens 350 also includes a vertical sidewall 356.

The lens 350 also includes an annular notch 358 formed therein as to facilitate the formation of a tapered primary lens section 360 with a tip 362 facing the electroluminescent semiconductor element of the LED switch device 12. The annular notch 358 also facilitates the formation of a secondary lens section 364 that encircles the tapered primary lens section 360 and interface with the same. More particularly, the vertical depth or extent of the annular notch 358 generally bisects the lens 350 into an upper portion 366 having a disc-shaped configuration (with the concave anterior surface 352) that at least partially interfaces with the tapered primary lens section 360, and a lower portion 368 having an annular or ring-shaped configuration that encircles the tapered primary lens section 360. The interior of the annular notch 358 may be defined by a vertical interior sidewall 370.

In this embodiment, the tapered primary lens section 360 has a spherical shape, though this is by way of example only and not of limitation. Earlier described embodiments contemplate a conical shape, and thus alternative tapered configurations may be readily substituted. The tip 362 faces the LED switch device 12, which is defined by the light emitting side 24 and an opposed base side 26. The touch sensor contacts embedded within the package of the LED switch device 12 are understood to be disposed toward the light emitting side 24. The LED switch device 12 may be substituted with a conventional output-only LED while retaining touch input capabilities by virtue of a conductive trace being provided on the top face 28 of the printed circuit board 14 and connected to a touch sensor controller, as will be described in further detail below.

The LED switch device 12 may be mounted to the bottom face 30 of the printed circuit board 14, with the eighth embodiment of the optic assembly 16h being mounted to its top face 28. The annular notch 358 of the lens 350 opens to the opening 32 of the printed circuit board 14, with the light emitting side 24 of the LED switch device 12 being axially aligned with the tapered primary lens section 360 and its tip 362 in particular. The tip 362 is understood to be co-extensive with the posterior surface 354 of the lens 350.

Figure 13:
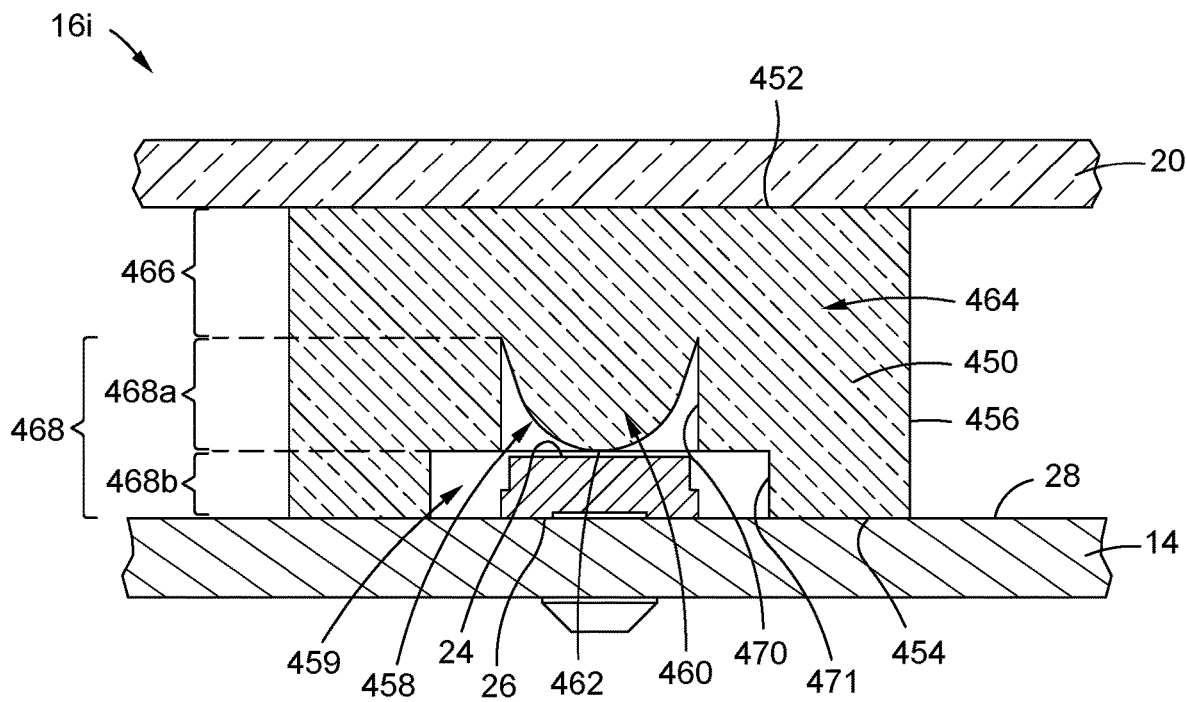
FIG. 13 is a cross-sectional view of an ninth embodiment of the optic assembly with the primary lens section having a spherical taper, a secondary lens section with a flat face, and the electroluminescent semiconductor element being mounted on the same side of the printed circuit board as the integral lens.

A ninth embodiment of the optic assembly 16i is illustrated in FIG. 13, and is understood to incorporate a combination of the various features discussed above. More particularly, the LED switch device 12 and the optics are mounted to the same side of the printed circuit board 14. The light-emitting side 24 of the LED switch device 12 face upwards toward the tip 462, while the base side 26 is attached to the printed circuit board 14. Additionally, the primary lens section has a spherical taper configuration, as will be described more fully below. The optic assembly 16i includes a lens 450 defined by an anterior surface 452 and an opposed posterior surface 454. The anterior surface 452 is understood to be flat and circular, as the lens 450 has a cylindrical shape with a vertical sidewall 456. The panel cover 20 is mounted to the optic assembly 16 facing the anterior surface 452 of the lens 450.

The lens 450 also includes an annular notch 458 formed therein as to facilitate the formation of a tapered primary lens section 460 with a tip 462 having a spherical shape that faces the electroluminescent semiconductor element of the LED switch device 12. The annular notch 458 includes a counterbore 459 that enlarges the diameter thereof and provide additional clearance for the LED switch device 12 as it is mounted on the same side of the printed circuit board 14. The annular notch 458 facilitates the formation of a secondary lens section 464 that encircles the tapered primary lens section 460 and interface with the same. The vertical depth or extent of the annular notch 458 generally bisects the lens 450 into an upper portion 466 having a flat, disc-shaped configuration that at least partially interfaces with the tapered primary lens section 460, and a lower portion 468 having an annular or ring-shaped configuration, at least a part of which encircles the tapered primary lens section 460.

The lower portion 468 may be segregated into a first half 468a that encircles the tapered primary lens section 460, and a lower half 468b that defines the aforementioned counterbore 459. The interior of the annular notch 458 may be defined by a first vertical interior sidewall 470, along with a second vertical interior sidewall 471 corresponding to that of the counterbore 459. The height of the second vertical interior sidewall 471 is understood to be substantially equivalent to that of the LED switch device 12, while the height of the first vertical interior sidewall 470 is understood to be substantially equivalent to that of the tapered primary lens section 460.

Figure 14:
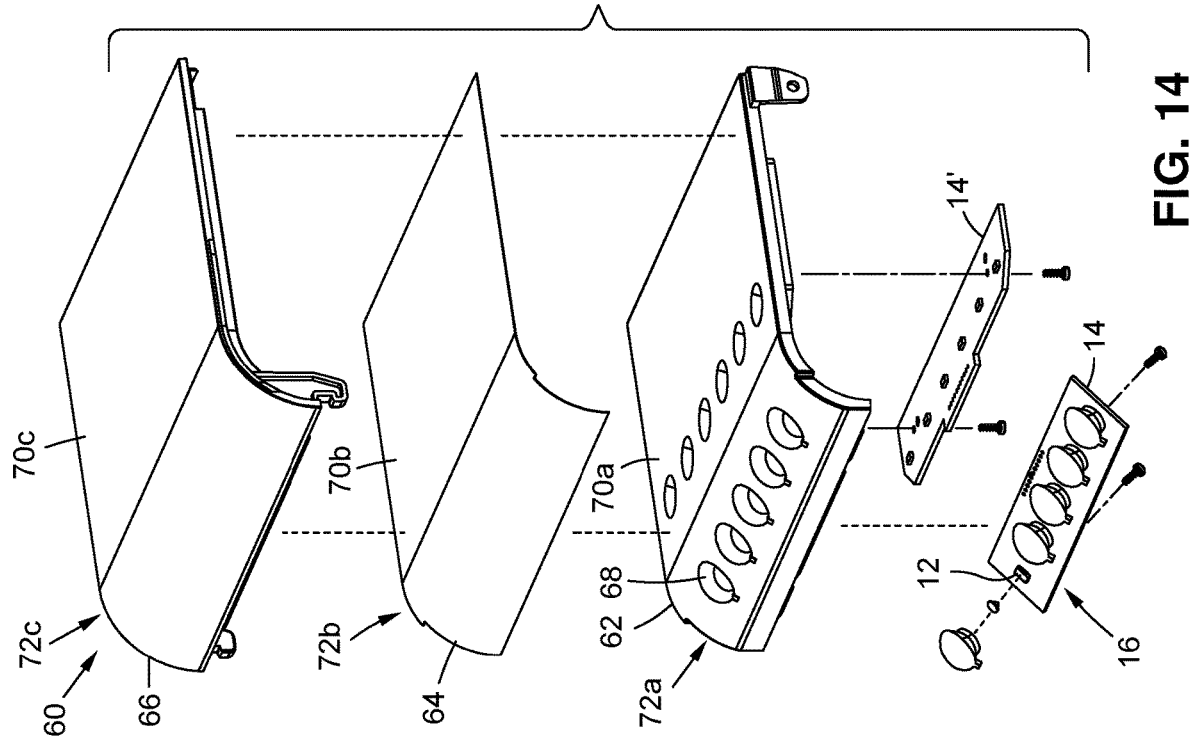
FIG. 14 is a perspective view of another embodiment of the illuminated indicator panel according to the present disclosure.

FIG. 14 shows another embodiment of the illuminated indicator panel 10″ utilized in an electronic device having various operational states indicated by outputs and controlled by inputs. The generating of such outputs and the reception of such inputs, which may be independent of each other, is understood to be implemented with the touch-sensitive LED switch device 12, or in the alternative, a conventional LED in combination with additional touch sensor contacts provided as conductive traces on the printed circuit board 14.

The LED switch device 12 is mounted to the printed circuit board 14 that interconnects the various input and output lines from the LED switch device 12 to the touch sensor controller, the LED driver circuit, and the microcontroller. Like the previously described embodiments, the optic assembly 16 is also mounted to the printed circuit board 14.

The illuminated indicator panel 10″ includes a different configured panel cover 60 that has a base frame 62, an intermediate film or overlay 64, and a top cover 66. The printed circuit board 14 is mounted to the base frame, which defines a plurality of openings 68 for each combination of the LED switch device 12 and optic assembly 16. Each component of the panel cover 60 is generally defined by a flat top portion 70, and a curved portion 72. The openings 68 are defined along the length of the curved portion 72 and is contemplated to angle the LED switch device 12 and the indicating/input functions thereof toward the user. There may be a second printed circuit board 14′ with a different set of LED switch devices 12 mounted thereto that are configured to be visible and/or activated from the flat top portion 70.

The intermediate film or overlay 64 may also include indicia that are positioned in alignment with the optic assemblies 16 and the openings 68 on the base frame 62. These indicia may be made with a fluorescent paint/ink that is visible only when exposed to ultraviolet light, and may be silk-screen printed, pad-printed, or spray painted on to either the top or bottom face of the intermediate film or overlay 64. Alternatively, in the context of the embodiments illustrated in FIG. 1, such indicia may be made on either the top or bottom face of the cover panel 20. In such embodiments the LED switch device 12 may have an ultraviolet wavelength emission, in addition to a visible light wavelength emission. The indicia that is visible under a visible light wavelength emission may be incorporated into the optic assembly 16, so the different indicia from the same opening 68 may be selectively rendered visible in response to ultraviolet and visible light emissions.

Figure 15:
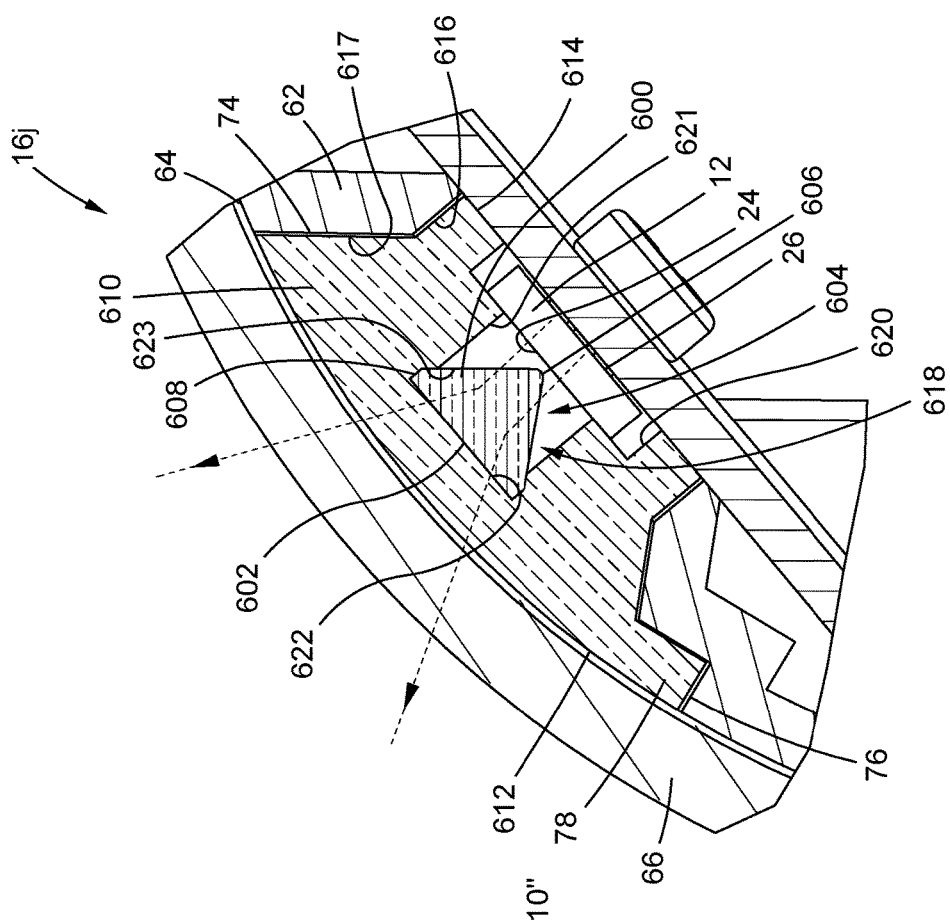
FIG. 15 is a cross-sectional view of a tenth embodiment of the optic assembly incorporated into the illuminated indicator panel shown in FIG. 14.

The tenth embodiment of the optic assembly 16j utilized in the illuminated indicator panel 10″ is show in greater detail in FIG. 15. In this embodiment, the LED switch device 12 and the optics are mounted to the same side of the printed circuit board 14. In particular, there is a primary lens 600 that is defined by a primary lens anterior surface 602 and an opposed primary lens rear taper 604 with a tip 606. The primary lens 600 may be defined by an outer cylindrical wall 608 between the primary lens anterior surface 602 and the primary lens rear taper 604. Again, by way of example, the primary lens anterior surface 602 may be circular, and the primary lens rear taper 604 may have a conical shape, though alternative geometries for these elements are also possible, as discussed in further detail above. The tip 606 faces the LED switch device 12, which, again, is defined by the light emitting side 24 and the opposed base side 26.

A secondary lens 610 interfaces with the top face 28 of the printed circuit board and is generally defined by a secondary lens anterior surface 612 and an opposed secondary lens posterior surface 614. In this alternative configuration of the illuminated indicator panel 10″, the opening 68 in the base frame 62 defines a tapered countersink 74 to which the secondary lens 610 is coupled. Accordingly, the secondary lens 610 is defined by a corresponding tapered wall 617 as well as a short vertical sidewall 616. In the illustrated example, the secondary lens anterior surface 612 has a circular shape, with a convex profile that is contemplated to match the convex back face of the intermediate film or overlay 64 as well as the top cover 66. The base frame 62 also defines an alignment keyway 76 within the tapered countersink 74. Thus, the secondary lens 610 may further include a key portion 78 that is sized and configured to engaged with the keyway 76. The convex curvature of the secondary lens anterior surface 612 is maintained throughout its entirety. The secondary lens posterior surface 614 has a circular outer profile.

The secondary lens 610 further defines a central cavity 618, with its opening toward the secondary lens posterior surface 614. The central cavity 618 has a stepped cylindrical configuration with a first vertical sidewall 620 that is sized and configured to accept the LED switch device 12, and a second vertical sidewall 621 that is sized and configured to accept the primary lens 600. The central cavity 618 is additionally defined by a circular base cavity wall 622 that is slightly oversized relative to the diameter of the second vertical sidewall 621 and may additionally have an offset thickness 623 that effectively forms a flanged opening toward the circular base cavity wall 622. The secondary lens posterior surface 614 has a generally annular profile.

Fitted in the central cavity 618 is the primary lens 600 and the LED switch device 12, with the primary lens 600 being within the portion of the central cavity 618 corresponding to the second vertical sidewall 621 and the offset thickness 623, and the LED switch device 12 being within the portion of the central cavity 618 corresponding to the first vertical sidewall 620.

The diameter of the primary lens 600/the circumference of its outer cylindrical wall 608 is understood to be sized and configured for a frictional retention of the primary lens 600 within the second vertical sidewall 621 as well as the offset thickness 623 of the central cavity 618. The primary lens anterior surface 602 also contacts or abuts against the circular base cavity wall 622. The primary lens anterior surface 602 is flat, so a substantial entirety thereof is understood to contact a substantial entirety of the circular base cavity wall 622. Like the other embodiments having the primary lens rear taper 604, the second vertical sidewall 621 of the secondary lens 610 together with the primary lens rear taper 604 define a reverse conical notch. The specific reference to the conical notch is understood to be by way of example only and not of limitation, as this feature may take on alternative geometric shapes as discussed above.

The height of the primary lens 600 is understood to substantially correspond to the depth of the central cavity 618 spanning the second vertical sidewall 621 and the offset thickness 623, while height of the LED switch device 12 is understood to substantially correspond to the depth of the central cavity 618 spanning the first vertical sidewall 620. The secondary lens posterior surface 614 abuts against the top face 28 of the printed circuit board 14, and the first vertical sidewall 620 is oversized to accommodate the LED switch device 12. The primary lens 600 is positioned immediately above the LED switch device 12. The principal axis of the primary lens 600 is in alignment with the center, light-emitting portion of the LED switch device 12. The output from the LED switch device 12 is transmitted through the primary lens 600 and diffused through the secondary lens 610 to evenly illuminate any indicia on either the intermediate film or overlay 64 positioned on top of the secondary lens anterior surface 612, or on the secondary lens anterior surface 612 itself.

Figure 16:
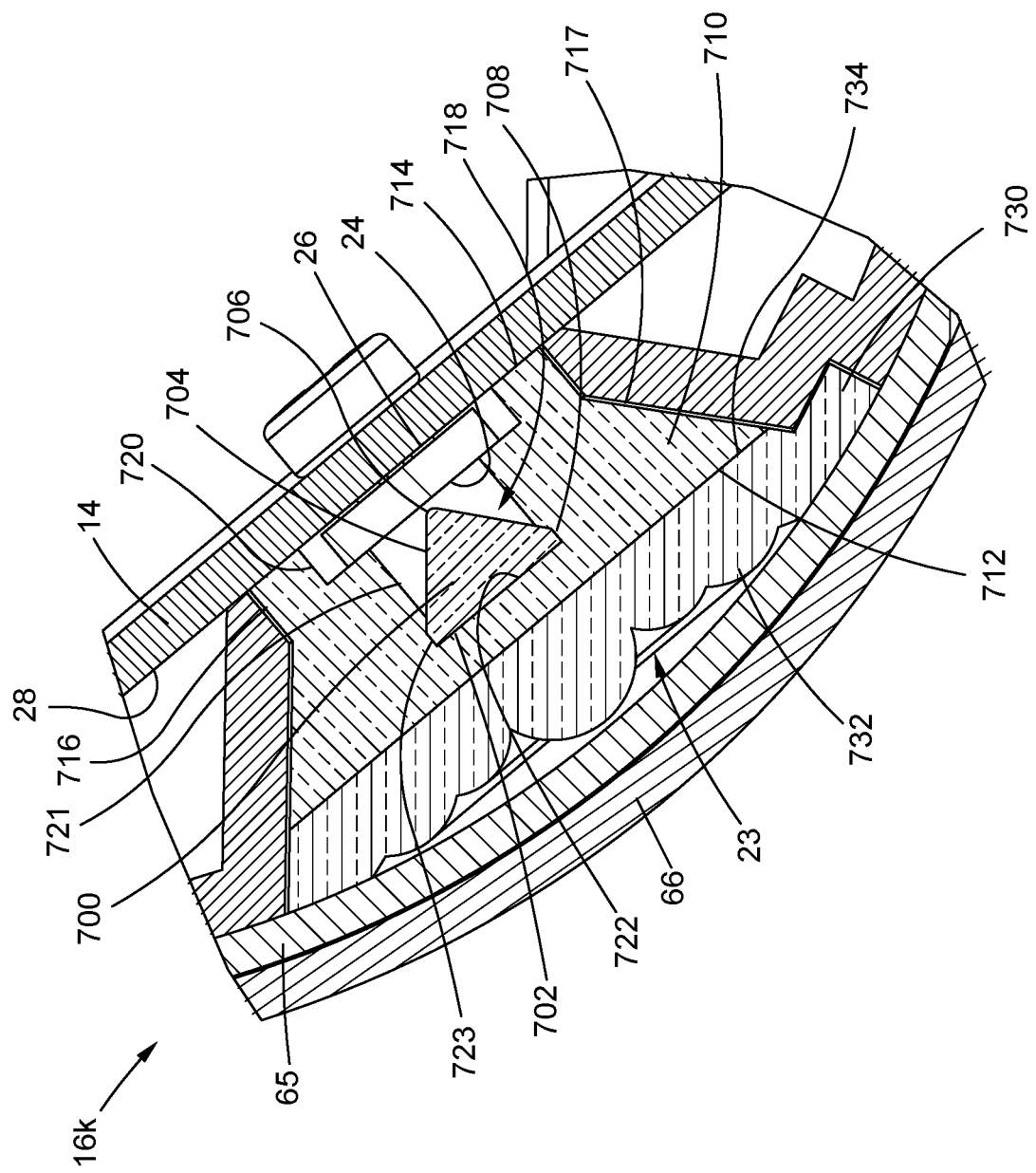
FIG. 16 is a cross-sectional view of a eleventh embodiment of the optic assembly with a tertiary lens, and may be incorporated into the illuminated indicator panel.

FIG. 16 depicts an eleventh embodiment of the optic assembly 16k that may be utilized in the illuminated indicator panel 10″. Again, the LED switch device 12 and the optics are mounted to the same side of the printed circuit board 14. There is a primary lens 700 defined by a primary lens anterior surface 702 and an opposed primary lens rear taper 704 with a tip 706. The primary lens 700 may be defined by an outer cylindrical wall 708 between the primary lens anterior surface 702 and the primary lens rear taper 704. The primary lens anterior surface 702 may be circular, and the primary lens rear taper 704 may have a conical shape, but alternatives are possible as discussed above. The tip 706 faces the LED switch device 12, which, again, is defined by the light emitting side 24 and the opposed base side 26.

A secondary lens 710 interfaces with the top face 28 of the printed circuit board 14 and is generally defined by a secondary lens anterior surface 712 and an opposed secondary lens posterior surface 714. The secondary lens 710 is defined by a tapered wall 717 as well as a short vertical sidewall 716, and the secondary lens anterior surface 712 may have a flat circular profile, though again, this is by way of example only. The modality by which the secondary lens 710 interfaces with the base frame 62 and the top cover 66 is the same with the eleventh embodiment of the optic assembly 16k as it is for the tenth embodiment of the optic assembly 16j discussed above, so additional details thereof will not be repeated.

The secondary lens 710 further defines a central cavity 718, with its opening toward the secondary lens posterior surface 714. The central cavity 718 has a stepped cylindrical configuration with a first vertical sidewall 720 that is sized and configured to accept the LED switch device 12, and a second vertical sidewall 721 that is sized and configured to accept the primary lens 700. The central cavity 718 is additionally defined by a circular base cavity wall 722 that is slightly oversized relative to the diameter of the second vertical sidewall 721 and may additionally have an offset thickness 723 that effectively forms a flanged opening toward the circular base cavity wall 722. Fitted in the central cavity 718 is the primary lens 700 and the LED switch device 12, with the primary lens 700 being within the portion of the central cavity 718 corresponding to the second vertical sidewall 721 and the offset thickness 723, and the LED switch device 12 being within the portion of the central cavity 718 corresponding to the first vertical sidewall 720.

The diameter of the primary lens 700/the circumference of its outer cylindrical wall 708 is understood to be sized and configured for a frictional retention of the primary lens 700 within the second vertical sidewall 721 as well as the offset thickness 723 of the central cavity 718. The primary lens anterior surface 702 contacts or abuts against the circular base cavity wall 722. The primary lens anterior surface 702 is flat, so a substantial entirety thereof is understood to contact a substantial entirety of the circular base cavity wall 722.

In addition, there is a tertiary lens 730 that is attached to or otherwise engaged with the secondary lens 710. The tertiary lens 730 is similarly defined by a tertiary lens anterior surface 732 and an opposed tertiary lens posterior surface 734 that abuts against the secondary lens anterior surface 712. Because the secondary lens anterior surface 712 is flat, the tertiary lens posterior surface 734 may also be flat such that a substantial entirety of one is positioned against the other, though this is by way of example only.

The tertiary lens 730 is contemplated to include a reverse relief of a three-dimensional symbol(s), letter(s), or other indicia 23. This indicia 23 may be molded, etched, or otherwise applied to the tertiary lens 730. In the illustrated example, such indicia 23 is made on the tertiary lens anterior surface 732, though it is possible to incorporate the same on the tertiary lens posterior surface 734. Such indicia 23 may be sanded/sand blasted or molded to define regions with greater translucency, or polished to define regions with greater transparency. In this regard, the tertiary lens 730 may be constructed of a clear or translucent plastic resin material, and may incorporate a UV light-sensitive pigment. It is understood that the tertiary lens 730 may be constructed of any of the materials mentioned above in relation to the construction of the primary lens or the secondary lens. Attached over the tertiary lens 730 is the aforementioned intermediate panel 65 that is positioned on top of the tertiary lens anterior surface 732. The top cover 66 is in turn attached to the intermediate panel 65. Various three-dimensionally sculpted, etched, or molded indicia are also contemplated for the intermediate panel 65, which may be made on either side. The combined illumination of the different indicia 22 on the top cover 66 and/or the intermediate panel 65, and the indicia 23 on the tertiary lens 730 may be used to produce a holographic or three-dimensional illumination effect. The surfaces of the indicia 23 or those on the intermediate panel 65 may also be coated with a fluorescent material that can be illuminated in response to an ultraviolet wavelength emission from the LED switch device 12. Thus, selective illumination of UV-sensitive material and visible light-material is contemplated.

Figure 17A:
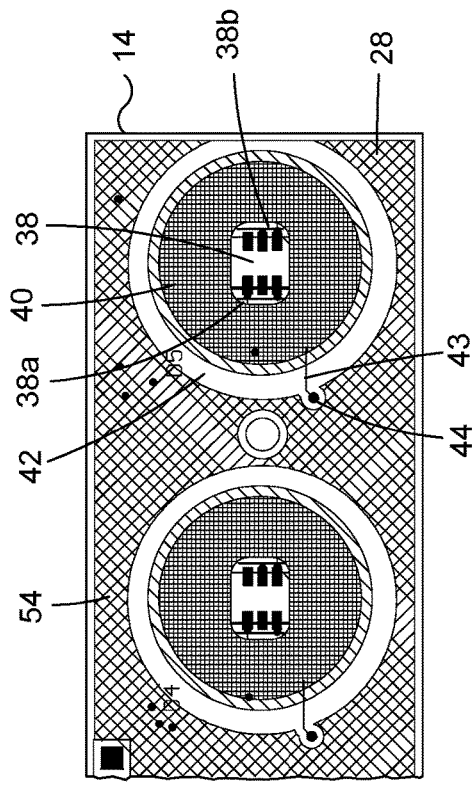
FIG. 17A is a top plan view of a first variation of a printed circuit board utilized in various embodiments of the present disclosure.
Figure 17B:
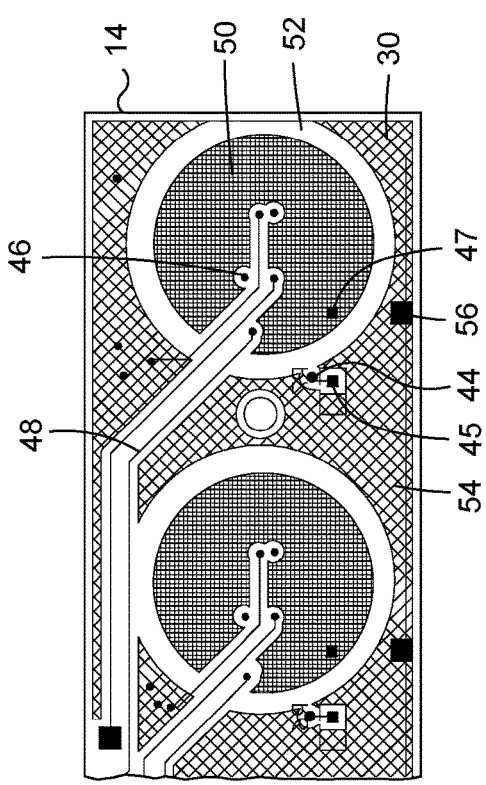
FIG. 17B is a bottom plan view of the first variation of the printed circuit board shown in FIG. 17A.

As mentioned above, the presently disclosed embodiments of the optic assemblies 16a-16k may be utilized with LED switch devices 12, that is, combination input and output devices. Further enhancements to capacitive touch sensing are contemplated based upon the configuration of the printed circuit board 14. FIG. 17A shows an exemplary layout of the top face 28, while FIG. 17B shows an exemplary layout of the bottom face 30. The illustrated printed circuit board 14 is understood to be utilized in connection with those embodiments of the optic assemblies 16 in which the LED switch device 12 and the optic is mounted to the same top face 28. Accordingly, the top face 28 defines a set of surface mount pads 38 for the surface mount contacts of the LED switch device 12.

The surface mount pads 38 are centrally disposed inside a conductive trace pad 40 that is, in turn, surrounded by an isolation channel 42. The profile of the optic assembly 16 is understood to be coextensive with that of the conductive trace pad 40 or extent slightly beyond the boundaries thereof, possibly to the outer boundary of the isolation channel 42. Accordingly, the conductive trace pad 40 is circular, though this is by way of example only and not of limitation. The conductive trace pad 40 is understood to be connected to a via 44 over a bridge trace 43 that crosses over the isolation channel 42. Further uses of the via 44 will be described below. The increased contact area of the conductive trace pad 40 is contemplated to improve capacitive touch input detection. Additionally, improved light dispersion is possible by coating the conductive trace pad 40 with a reflective material such as the aforementioned white or silver paint.

The LED switch device 12 includes terminals corresponding to the touch sensor contacts embedded therein, and there is a subset of surface mount pads 38a, 38b that are connected to the conductive trace pad 40 that is ultimately connected to the touch sensor controller with conductive traces 48. The bottom face 30 likewise includes a conductive trace pad 50 positioned in alignment with the conductive trace pad 40 on the reverse side of the printed circuit board 14, that is, the top face 28. An isolation channel 52 surrounds the conductive trace pad 50. Like the conductive trace pad 40, the conductive trace pad 50 may be connected to a touch sensor controller to detect capacitive touch inputs. Both the conductive trace pad 40 on the top face 28 and the conductive trace pad 50 on the bottom face 30 are understood to be electrically conductive metal layers that are selectively etched around the same to define such features in a conventional printed circuit board. However, alternative embodiments with electrically conductive metal contacts that are attached to the printed circuit board 14 after its initial masking/etching fabrication process, or any other production process for the secured placement of the conductive trace pads 40, 50 in conjunction with the LED switch device 12 and the optic assembly 16 may be substituted.

As mentioned above, it is possible to utilize a conventional output-only LED instead of the LED switch device 12 while still retaining capacitive touch input capabilities. In this regard, the conductive trace pad 40 on the top face 28 may replace the touch sensor contacts that would otherwise be embedded in the LED switch device 12, and connected to the touch sensor controller, particularly in those embodiments where the LED is mounted to the top face 28 of the printed circuit board. The conductive trace pad 50 on the bottom face 30 of the printed circuit board 14 may be utilized together with the conductive trace pad 40 on the top face 28 and connected to the touch sensor controller to enhance sensitivity. In this configuration a jumper wire may be connected between a connection pad 45 that is electrically connected to the via 44, and to a connection pad 47 on the conductive trace pad 50. The conductive trace pad 50 and the conductive trace pad 40 may thus be electrically connected.

Alternatively, the conductive trace pad 50 on the bottom face 30 of the printed circuit board 14 may be tied to ground, and in which case, serve as a shield for the conductive trace pad 40 on the top face 28 of the printed circuit board 14 to prevent unwanted input from the rear side. This may be useful in applications such as greeting cards where an inadvertent approach of a capacitive element (e.g., a hand) that would otherwise be detected as an input. With the shielding made possible by tying the conductive trace pad 50 to ground, detecting a hand that holds the apparatus/card is not understood to be detected as an input; only those haptic inputs on the front face of the card, that is, a capacitive element approaching from the front or the secondary lens anterior surface 112 is detected. Along these lines, beyond the boundaries of the isolation channels 42 and 52 may include a conductive plane 54 on each of the top face 28 and the bottom face 30 of the printed circuit board 14. The conductive planes 54 are tied to ground, which is contemplated to mitigating and blocking interference of capacitance change from other nearby components. In further detail, a jumper wire may instead be connected from the connection pad 47 on the conductive trace pad 50 to a grounding pad 56.

Figure 18A:
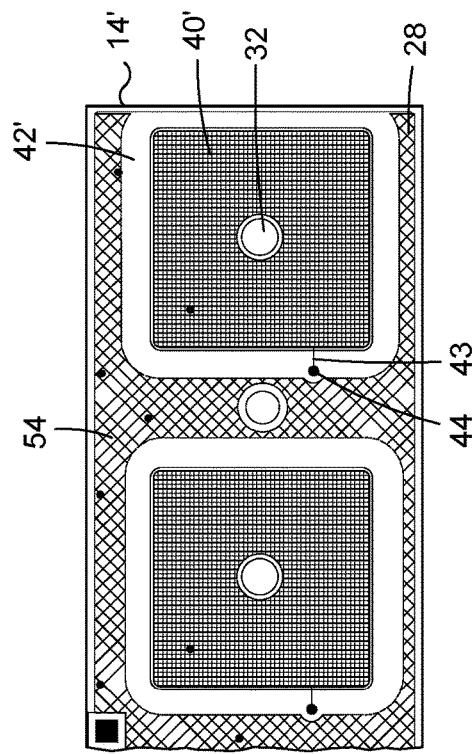
FIG. 18A is a top plan view of a second variation of a printed circuit board utilized in various embodiments of the present disclosure.
Figure 18B:
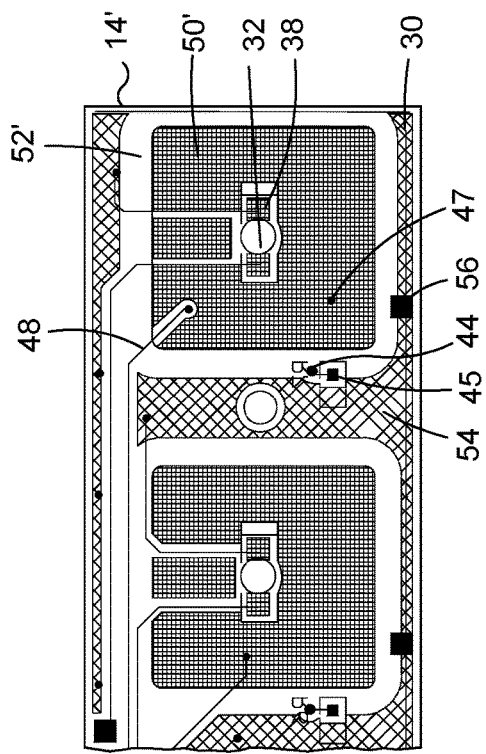
FIG. 18B is a bottom plan view of the second variation of the printed circuit board shown in FIG. 18A.

FIGS. 18A and 18B depict an alternative configuration of the printed circuit board 14' in which the LED switch device 12 is mounted to the bottom face 30 thereof, opposite the top face 28 on which the optic assembly 16 is mounted. The surface mount pads 38 are located on the bottom face 30 of the printed circuit board and includes the opening 32 through which the illumination from the LED switch device 12 is transmitted toward the optic assembly 16 mounted on the other side. Surrounding the opening 32 and the surface mount pads 38 is the conductive trace pad 50', which has an exemplary rectangular shape with rounded corners. Again, this shape may be substituted with other geometric shapes without departing from the scope of the present disclosure. The conductive trace pad 50' is, in turn, surrounded by an isolation channel 52' The conductive trace pad 50' is understood to serve the same functional purposes as the conductive trace pad 50, that is, as an additional touch sensor contact, or as a grounded shield. Again, the conductive trace pad 40' and the conductive trace pad 50' may be fabricated in various ways, as discussed above in relation to the conductive trace pad 40 and the conductive trace pad 50.

The conductive trace pad 50' may thus be connected to the conductive trace pad 40' by way of the bridge trace 43, the via 44, and the connection pad 45 that is connected to the connection pad 47 on the conductive trace pad 50'. Alternatively, the conductive trace pad 50' may be connected to ground by connecting the connection pad 47 to the grounding pad 56.

The top face 28 of the printed circuit board 14' likewise includes a conductive trace pad 40' that is substantially coextensive with the conductive trace pad 50' on the reverse side and surrounded by an isolation channel 42'. The conductive trace pad 40' also serves a similar functional purpose as the conductive trace pad 40 of another capacitive touch sensor contact that enhances detection. The bridge trace 43 is connected to the conductive trace pad 40', over the isolation channel 42', and the via 44. The traces 48 are understood to connect the conductive trace pads 40', 50' to the touch sensor controller.

The particulars shown herein are by way of example and for purposes of illustrative discussion of the embodiments of an optic for LEDs and LED switch devices and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. An illuminated indicator panel comprising:
   a printed circuit board;
   one or more electroluminescent semiconductor devices mounted to the printed circuit board;
   one or more lenses each having a unitary structure defined by a primary lens section and a secondary lens section with a common anterior surface, and respective posterior surfaces spaced apart from each other, the posterior surface of the primary lens section facing a respective one of the electroluminescent semiconductor devices, the lenses being mounted to interface with the printed circuit board; and
   a panel cover with one or more indicia thereon overlapping each of the one or more lenses with the panel cover mounted thereto.

2. The illuminated indicator panel of claim 1, wherein the common anterior surface has a profile selected from a group consisting of: flat, convex, and concave.

3. The illuminated indicator panel of claim 1, wherein the posterior surface of the primary lens section has a profile selected from a group consist of: flat, convex, and concave.

4. The illuminated indicator panel of claim 1, wherein the posterior surface of the secondary lens section encircles the posterior surface of the primary lens section.

5. The illuminated indicator panel of claim 4, wherein the posterior surface of the secondary lens section has a flat profile.

6. The illuminated indicator panel of claim 1, further comprising an intermediate overlay between the panel cover and the one or more lenses, the intermediate overlay including one or more indicia overlapping each of the one or more lenses with the intermediate overlay mounted thereto.

7. The illuminated indicator panel of claim 6, wherein the panel cover includes one or more indicia that are illuminated in response to a first emission wavelength output from the one or more electroluminescent semiconductor devices and the indicia on the intermediate overlay is fluorescent and illuminated in response to a second emission wavelength output from the one or more electroluminescent semiconductor devices.

8. The illuminated indicator panel of claim 1, wherein sections of the printed circuit board overlapping the secondary lens section have a light-reflective coating.

9. The illuminated indicator panel of claim 1, wherein sections of the printed circuit board overlapping the secondary lens section have a conductive layer connected to an input of a touch sensor controller.

10. The illuminated indicator panel of claim 1, wherein sections on an opposite side of the printed circuit board overlapping the secondary lens section have a conductive layer connected to an input of a touch sensor controller.

11. The illuminated indicator panel of claim 1, wherein sections on an opposite side of the printed circuit board overlapping the secondary lens section have a conductive layer connected to ground.

12. The illuminated indicator panel of claim 1, wherein:
   the printed circuit board is defined by a top face and an opposed bottom face;
   a first conductive layer is on the top face of the printed circuit board surrounding a region on which one of the one or more electroluminescent semiconductor devices is mounted, the first conductive layer being connectible to an input of a touch sensor controller; and
   a second conductive layer is on the bottom face of the printed circuit board surrounding the region on which the one of the one or more electroluminescent semiconductor devices is mounted, the first conductive layer and the second conductive layer being in axial alignment.

13. The illuminated indicator panel of claim 12, wherein the second conductive layer is connected to the input of the touch sensor controller.

14. The illuminated indicator panel of claim 12, wherein the second conductive layer is connected to ground.

15. An illuminated indicator panel comprising:
a printed circuit board;
one or more electroluminescent semiconductor devices mounted to the printed circuit board;
one or more lenses each having a unitary structure defined by a primary lens section and a secondary lens section with a common anterior surface, and respective posterior surfaces spaced apart from each other, the posterior surface of the primary lens section facing a respective one of the electroluminescent semiconductor devices, the lenses being mounted to interface with the printed circuit board, one or more indicia being provided on the one or more lenses.

16. The illuminated indicator panel of claim 15, wherein:
the printed circuit board is defined by a top face and an opposed bottom face;
a first conductive layer is on the top face of the printed circuit board surrounding a region on which one of the one or more electroluminescent semiconductor devices is mounted, the first conductive layer being connectible to an input of a touch sensor controller; and
a second conductive layer is on the bottom face of the printed circuit board surrounding the region on which the one of the one or more electroluminescent semiconductor devices is mounted, the first conductive layer and the second conductive layer being in axial alignment.

17. The illuminated indicator panel of claim 15, wherein the one or more indicia on the one of the one or more lenses has a form selected from the group consisting of: printing, painting, molding, etching, and laser etching.

18. An illuminated indicator panel comprising:
a printed circuit board;
one or more electroluminescent semiconductor devices mounted to the printed circuit board;
one or more lenses each having a unitary structure defined by a primary lens section and a secondary lens section with a common anterior surface, and respective posterior surfaces spaced apart from each other, the posterior surface of the primary lens section facing a respective one of the electroluminescent semiconductor devices, the lenses being mounted to interface with the printed circuit board;
a panel cover;
an intermediate overlay between the panel cover and the one or more lenses, the intermediate overlay including one or more indicia overlapping each of the one or more lenses with the intermediate overlay mounted thereto.

19. The illuminated indicator panel of claim 18, wherein:
the printed circuit board is defined by a top face and an opposed bottom face;
a first conductive layer is on the top face of the printed circuit board surrounding a region on which one of the one or more electroluminescent semiconductor devices is mounted, the first conductive layer being connectible to an input of a touch sensor controller; and
a second conductive layer is on the bottom face of the printed circuit board surrounding the region on which the one of the one or more electroluminescent semiconductor devices is mounted, the first conductive layer and the second conductive layer being in axial alignment.

20. The illuminated indicator panel of claim 18, wherein the one or more indicia on the intermediate overlay has a form selected from the group consisting of: printing, painting, die-cutting, molding, etching, and laser etching.

* * * * *